United States Patent
Jia et al.

(10) Patent No.: US 9,871,472 B2
(45) Date of Patent: Jan. 16, 2018

(54) ENERGY-HARVESTING APPARATUS WITH PLURAL MECHANICAL AMPLIFIERS

(71) Applicant: Cambridge Enterprise Limited, Cambridge (GB)

(72) Inventors: Yu Jia, Cambridgeshire (GB); Jize Yan, Cambridgeshire (GB); Ashwin Arunkumar Seshia, Cambridgeshire (GB); Kenichi Soga, Cambridgeshire (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 14/402,670

(22) PCT Filed: May 24, 2013

(86) PCT No.: PCT/IB2013/054314
§ 371 (c)(1),
(2) Date: Nov. 20, 2014

(87) PCT Pub. No.: WO2013/175449
PCT Pub. Date: Nov. 28, 2013

(65) Prior Publication Data
US 2015/0135869 A1    May 21, 2015

(51) Int. Cl.
*H02N 2/18* (2006.01)
*H01L 41/113* (2006.01)
(Continued)

(52) U.S. Cl.
CPC .............. *H02N 2/188* (2013.01); *F03G 7/08* (2013.01); *H01L 41/1136* (2013.01); *H02K 35/02* (2013.01); *Y10T 74/18856* (2015.01)

(58) Field of Classification Search
CPC .............................. H02N 2/186; H02N 2/188
(Continued)

(56) References Cited

U.S. PATENT DOCUMENTS

| 5,801,475 A | 9/1998 | Kimura |
| 6,252,336 B1 * | 6/2001 | Hall ..................... G08B 3/1041 310/319 |

(Continued)

FOREIGN PATENT DOCUMENTS

| CN | 1137194 A | 12/1996 |
| CN | 102170248 A | 8/2011 |

(Continued)

OTHER PUBLICATIONS

Prabha R., et al. Increasing Electrical damping in Energy-Harnessing Transducers, 2011, IEEE, 1-5.*
(Continued)

*Primary Examiner* — J. San Martin
(74) *Attorney, Agent, or Firm* — John B. Hardaway, III; Nexsen Pruet, LLC

(57) ABSTRACT

An energy harvester is provided for harvesting energy, and in particular electrical energy from an input vibration such as an ambient vibration. The energy harvester comprises a first mechanical amplifier responsive to the input vibration and a second mechanical amplifier coupled to the first mechanical amplifier. At least one of the first and second mechanical amplifiers comprises a parametric resonator, and a power output of the energy harvester is generated by damping the second mechanical amplifier.

23 Claims, 27 Drawing Sheets

(51) Int. Cl.
*F03G 7/08* (2006.01)
*H02K 35/02* (2006.01)

(58) Field of Classification Search
USPC .......................................................... 310/339
See application file for complete search history.

(56) References Cited

U.S. PATENT DOCUMENTS

| | | | |
|---|---|---|---|
| 6,407,484 | B1 | 6/2002 | Oliver et al. |
| 6,984,902 | B1 | 1/2006 | Huang et al. |
| 7,258,533 | B2 * | 8/2007 | Tanner .................. F04B 43/046 310/339 |
| 7,301,254 | B1 | 11/2007 | Lal et al. |
| 2005/0253486 | A1 * | 11/2005 | Schmidt .............. H01L 41/1136 310/329 |
| 2006/0087200 | A1 * | 4/2006 | Sakai ..................... H02N 2/183 310/339 |
| 2010/0072759 | A1 | 3/2010 | Andosca et al. |
| 2011/0074162 | A1 | 3/2011 | Cottone et al. |

FOREIGN PATENT DOCUMENTS

| | | | | |
|---|---|---|---|---|
| CN | 102217184 | A | 10/2011 | |
| DE | WO 2007134891 | A1 * | 11/2007 | ........... B60C 23/041 |
| WO | 2007/039733 | A1 | 4/2007 | |
| WO | 2011/041689 | A1 | 4/2011 | |
| WO | 2011041689 | A2 | 4/2011 | |
| WO | 2011041689 | A3 | 4/2011 | |

OTHER PUBLICATIONS

Jia et al., "Multi-Frequency Operation of a MEMS Vibration Energy Harvester by Accessing Five Orders of Parametric Resonance", Journal of Physics, 2013, pp. 1-5, IOP Publishing Ltd., Cambridge, United Kingdom.
Jia et al., "Directly and Parametrically Excited Bi-Stable Vibration Energy Harvester for Broadband Operation", IEEE, Jun. 16-20, 2013, pp. 454-457, Transducers, Barcelona, Spain.
Jia et al., "Parametrically Excited MEMS Vibration Energy Harvesters with Design Approach to Overcome the Initiation Threshold Amplitude", Journal of Micromechanics and Microengineering, Mar. 24, 2013, 16 pages, vol. 23, No. 11, IOP Publishing Ltd., Cambridge, United Kingdom.
Jia et al., "Parametric Resonance for Vibration Energy Harvesting with Design Techniques to Passively Reduce the Initiation Threshold Amplitude", Smart Materials and Structures, Apr. 25, 2014, IOP Publishing Ltd., Cambridge, United Kingdom.
Jia et al., "An Auto-Parametrically Excited Vibration Energy Harvester", Sensors and Actuators, Sep. 22, 2014, pp. 69-75, Elsevier B.V., Cambridge, United Kingdom.
Jia et al., A Parametrically Excited Vibration Energy Harvester, Journal of Intelligent Material Systems and Structures, 2013, pp. 1-12, Sage, Cambridge, United Kingdom.
Steiner, Markus, "International Search Report", ISA/EP, Oct. 29, 2013, 5 pages, PCT/IB2013/054314.
Zhou, Y, "Microjoining and Nanojoining", Institute of Materials, 2008, p. 186, Woodhead Publishing and Maney Publishing.
Marton, L. et al., "Methods of Experimental Physics", Problems and Solutions for Students, 1969, p. 1, vol. 8, Academic Press, New York and London.
Cleland, A.N., "Foundations of Nanomechanics: From Solid-State Theory to Device Applications", 2002, p. 321, Springer-Verlag Berlin and Heidelberg.
Zhang, D., "Advanced Mechatronics and MEMS Devices", Microsystems, 2013, p. 39, IBSN 978-1-4419-9985-6, Springer, New York, (ebook).
Priya, S. et al., "Energy Harvesting Technologies", 2009, p. 449, e-ISBN: 978-0-387-76464-1, Springer, New York.
Nakra, B.C. et al., "Instrumentation Measurement and Analysis", 1985, p. 145-151, ISBN 0-07-048296-9, Tata McGraw-Hill Publishing.
Bolton, W., "Industrial Control and Instrumentation", Pearson Education, 1991, p. 80, ISBN 81-7371-364-2, Longman Group.
CN Search Report; CN201380039064.6; Aug. 31, 2016.
Jenkins, Peter David; EP2856628; Notice of Opposition to a European Patent; 34 pages; Feb. 3, 2017.
Daqaq M. F. et al., "Investigation of Power Harvesting via Parametric Excitations", Journal of Intelligent Material Systems and Structures, Mar. 1, 2009, pp. 545-557, vol. 20, No. 5, Technomic Publ, Lancaster, PA.
Abdelkefi, A. et al., "Global Nonlinear Distributed-Parameter Model of Parametrically Excited Piezoelectric Energy Harvesters", Nonlinear Dynamics, May 12, 2011, pp. 1147-1160, vol. 67, No. 2, Kluwer Academic Publishers, Blacksburg, VA.
Stabler, Christopher, "Parametric Instabilities for Vibratory Energy Harvesting under Harmonic, Time-Varying Frequency, and Random Excitations", Clemson University, Aug. 2010, 88 pages.
Zhou, Wanlu et al., "An Efficient Vibration Energy Harvester with a Multi-mode Dynamic Magnifier", Smart Materials and Structures, 21 (2012) 015014, Dec. 20, 2011, 9 pages.
Tang, Xiudong et al., "Enhanced Design of Vibration Energy Harvester Using Dual Masses", Proceedings of the ASME 2011 International Design Engineering Technical Conferences & Computers and Information in Engineering Conference, IDETC/CIE, Aug. 28-31, 2011, 9 pages, Washington DC, USA.

* cited by examiner

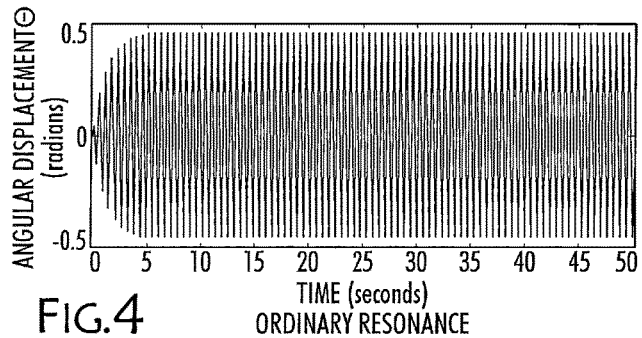
FIG.4 ORDINARY RESONANCE
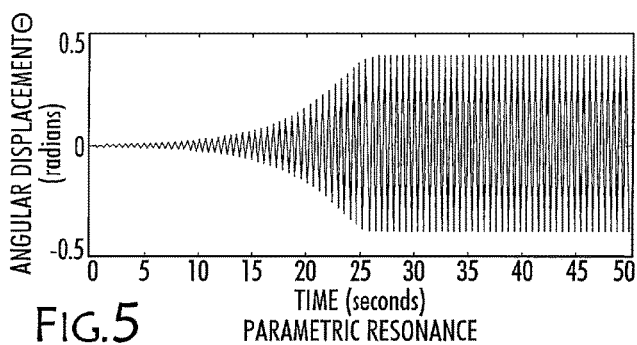
FIG.5 PARAMETRIC RESONANCE
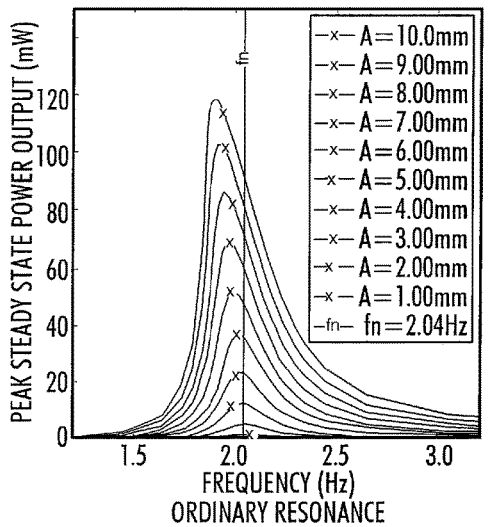
FIG.6A ORDINARY RESONANCE
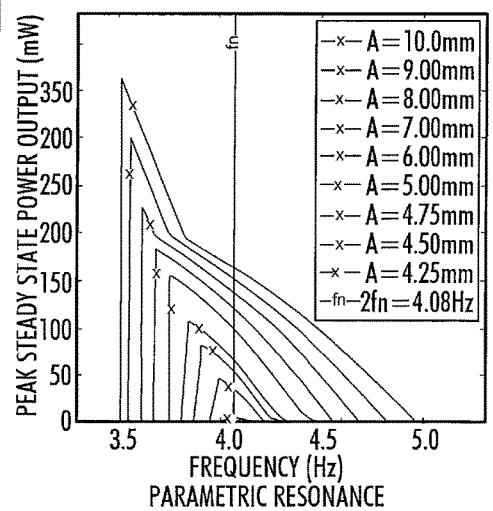
FIG.6B PARAMETRIC RESONANCE (a) Ordinary, $V_{pp}$ = 21.8 V    (b) Parametric, $V_{pp}$ = 56.4 V

ENERGY-HARVESTING APPARATUS WITH PLURAL MECHANICAL AMPLIFIERS

The invention relates to an energy-harvesting apparatus and method, for harvesting or collecting energy from a source of vibration, such as ambient or environmental vibration.

In a conventional energy harvester a direct resonator, or in some cases a plurality of direct resonators, is responsive to an input vibration, such as vibration of a structure to which the energy harvester is attached. (In the art, direct resonators may also be termed linear, or ordinary, resonators.) The vibration excites the resonator(s) and the resonator(s) are electrically damped, for example by means of a permanent magnet carried by a resonator so that it oscillates in the proximity of a conducting coil, to extract an electrical power output. Such energy harvesters can be used to charge a battery or to operate an electronic device such as a sensor and/or a wireless transmitter in a self-contained device, in known manner.

Such conventional energy harvesters suffer from several problems which limit their efficacy for converting vibration energy into electrical energy. Two problems in particular relate to the performance of the resonator(s). First, the resonator in a conventional energy harvester has a specific resonant frequency and can only be effectively excited by vibration frequencies close to that resonant frequency. Natural or ambient vibrations available for driving an energy harvester tend to contain a variety or spectrum of vibration frequencies and a direct resonator may only be excited by a narrow band of the available vibration frequencies close to the resonant frequency of the resonator. One approach which has been used to address this is to incorporate into an energy harvester a plurality of direct resonators of different resonant frequencies, but this adds to the complexity of the energy harvester. Second, the power density storable in a direct resonator is limited as a linear function of the driving vibration amplitude, and this constrains the energy which can be transferred from an input vibration to a resonator in a conventional energy harvester.

The inventors consider that an alternative approach to addressing these limitations of conventional energy harvesters may be to use the phenomenon of parametric resonance. But the inventors are aware of only one prior art attempt to investigate the use of parametric resonance for energy harvesting, and this investigation found a significant problem. This is described in a paper by M. Daqaq, C. Stabler, Y. Qaroush and T. Seuaciuc-Osório, "Investigation of Power Harvesting via Parametric Excitations", *J. Intel. Mat. Syst Str.*, vol. 20, no. 5, pp. 547-557, 2009. Daqaq et al. carried out a laboratory study of the behaviour of a parametrically-excited resonator in the form of an elastic cantilever beam carrying a proof weight. The resonance of the beam was electrically damped to extract an electrical power output. The problem reported by Daqaq et al. is that a threshold vibration amplitude is required to excite a parametric resonator, and that as a result, the parametric resonator in their energy harvester could not harvest low-amplitude input vibrations. This dramatically reduced the energy that could be collected by their harvester. By contrast in a conventional energy harvester incorporating a direct resonator no such threshold vibration amplitude exists.

STATEMENT OF INVENTION

The invention provides an energy harvester and a method for harvesting energy as defined in the appended independent claims, to which reference should now be made. Preferred or advantageous features of the invention are set out in dependent sub-claims.

The invention in a preferred embodiment may thus provide an energy harvester comprising first and second mechanical amplifiers. The first mechanical amplifier is responsive to an input vibration, such as ambient or environmental vibration, so that the first mechanical amplifier can be excited or actuated by the vibration. The second mechanical amplifier is coupled to the first mechanical amplifier such that the first and second mechanical amplifiers operate as or provide first and second mechanical degrees of freedom. The first and second mechanical amplifiers may be coupled directly to each other or they may be coupled through one or more further mechanical degrees of freedom. At least one, but preferably only one, of the first and second mechanical amplifiers comprises a parametric resonator. An energy-harvester power output is generated by a damping process, but advantageously, or preferably, the damping process does not operate on the first mechanical amplifier. Preferably the energy-harvester power output is generated by damping the second mechanical amplifier.

In some aspects of the invention, damping processes for generating the energy-harvester power output may operate on both the first and second mechanical amplifiers, such that a portion of the total energy output of the energy harvester is extracted from each mechanical amplifier. But it is important in most implementations of the invention that the damping of the first mechanical amplifier is reduced or minimised, so that at least a portion of the energy output, and preferably all of the energy output, of the energy harvester is preferably extracted by damping the second mechanical amplifier.

Embodiments of the invention may thus take advantage of the characteristics of parametric resonance, including the broader bandwidth of exciting vibration frequencies and higher power density compared with a direct resonator, while the arrangement of coupled first and second mechanical amplifiers described herein acts to minimise or reduce the initiation threshold amplitude of the parametric resonator. This may advantageously solve the problem described by Daqaq et al. in the prior art and allow effective harvesting of smaller amplitude vibrations.

An illustration of the operating principle of the invention may be as follows. The behaviour of a parametric resonator can be described using the Mathieu equation, as described in more detail below. One aspect of the behaviour of a parametric resonator, as illustrated in FIG. 11, is that the initiation amplitude threshold increases as the damping of the resonator increases. In an energy harvester, damping (usually electrical damping) is required to generate a power output. Embodiments of the invention therefore use mechanical structures in which energy is harvested by excitation of a parametric resonator but in which the parametric resonator is either (1) undamped (the parametric resonator being coupled to a further mechanical amplifier which is damped to extract power) or (2) is driven through a mechanical amplifier which is undamped and can increase the drive amplitude coupled to the parametric resonator.

In option (1), since the parametric resonator is undamped, its initiation amplitude threshold may be minimised. In option (2), the parametric resonator may be damped to extract power, in which case its initiation amplitude threshold may be raised by the damping. However, the parametric resonator is driven through a mechanical amplifier which preferably increases the amplitude of the vibration input to the energy harvester, in order exceed the initiation amplitude threshold.

In option (2), a particular embodiment may be an auto-parametric resonator structure in which an input vibration drives a first mechanical amplifier, which comprises a direct or ordinary resonator. The first mechanical amplifier is coupled to a second mechanical amplifier, which comprises a parametric resonator. The resonant frequencies of the direct resonator and the parametric resonator are matched such that the resonant frequency of the direct resonator is a sub-multiple of the resonant frequency of the parametric resonator. (In other words, the resonant frequency of the parametric resonator is a multiple of the resonant frequency of the direct resonator, such as 2, 3 or 4 times its resonant frequency.) The combination of the two resonators thus functions as an auto-parametric resonator, in which parametric resonance can be driven by a very small initiation amplitude.

In options (1) and (2), the first mechanical amplifier (comprising the parametric resonator in option (1) and the mechanical amplifier for driving a parametric resonator in option (2)), is described as undamped. However, as described further above, in some embodiments of the invention both the first and second mechanical amplifiers may be damped to extract respective portions of the energy output of the energy harvester. In such embodiments an important factor is that at least some of the energy output is derived from the second mechanical amplifier, for example so that the damping of the first mechanical amplifier is reduced by its being coupled to the second mechanical amplifier.

The term mechanical amplifier means a device or structure, preferably a passive device or structure, which amplifies a mechanical displacement and/or force, and includes structures such as a lever, a parametric resonator or an ordinary resonator. The term parametric resonator means a resonator which is arranged to be driven in parametric resonance. A resonator structure may be capable of being driven as a parametric resonator or an ordinary resonator, typically depending on the orientation and frequency of the input vibration. A parametric resonator is therefore driven by an input vibration in parametric resonance and an ordinary resonator is driven by an input vibration in ordinary resonance. Such resonators may include structures such as bi-stable or multi-stable resonators, or bi-stable or multi-stable beams.

In this document, reference is made to damped and undamped mechanical amplifiers. In the real world, all mechanical structures are damped to some extent. In this document, the term undamped means that a mechanical amplifier is not directly connected to a damping mechanism for the extraction of power from an energy harvester. If a mechanical actuator is described as undamped, it may nevertheless be coupled to a damped mechanical actuator which is, for example, electrically damped to generate an energy-harvester power output. In such a case, although one mechanical amplifier is described as undamped, the electrical damping may extract some energy from both mechanical amplifiers, including the undamped and the damped mechanical amplifiers.

MEMS (microelectromechanical systems) implementations of energy harvesters may be suitable for implementing embodiments of the invention, and the three most popular mechanical-to-electrical transduction mechanisms implemented for MEMS vibration energy harvesters (VEH) are summarised below.

Electromagnetic: power output does not scale well with decreasing dimensions due to diminishing coil turn density and fill factor at smaller scales using current micromachining technologies. This technique is therefore more suitable for larger energy harvesters.

Electrostatic: mature MEMS technology, can be readily fabricated and integrated with IC technology. However, the peak power density, both theoretical and reported in the literature, is an order of magnitude lower than its counterparts.

Piezoelectric: scales well and offers high performance, especially PZT (piezoelectric transducer), but MEMS fabrication is less straightforward compared to electrostatics. AlN and ZnO based harvesters are now practically realisable with existing fabrication technology.

The following points summarise some important aspects of embodiments of the invention.

The damped Mathieu equation is used to describe the behaviour of a parametric resonator:

$$\ddot{x} + c\dot{x} + (\delta + 2\epsilon \cos(2t))x = 0$$

where x is displacement, c is damping, t is time domain, $\epsilon$ is a generic excitation amplitude parameter and $\delta$ is a generic natural frequency squared parameter.

FIG. 11 shows three bifurcation diagrams of the damped Mathieu equation, for different levels of damping of a parametric resonator. As shown in FIG. 11, with no damping c, no initiation amplitude threshold exists for the principal parametric resonance ($1^{st}$ order).

When parametric resonance is achieved, it is potentially capable of reaching higher amplitudes and broader frequency response than a conventional linear or direct resonator at its fundamental mode of resonance.

With increasing damping (mechanical damping always exists in resonators in the real world, and electrical damping is required to extract an electrical power output) initiation amplitude threshold increases. This is shown in the second and third diagrams in FIG. 11.

This initiation amplitude threshold causes a problem in accessing parametric resonance for small-amplitude input vibrations.

Embodiments of the invention use parametric resonance for vibration energy harvesting.

The invention aims to reduce the effect of this initiation threshold to practically realise a parametrically-excited vibration energy harvester.

This may be done by minimising or reducing electrical damping on the parametric resonator through electrically damping another coupled degree-of-freedom mechanical amplifier (either another resonator or a non-resonating mechanical amplifier such as a lever). This is option (1) described above, and may intrinsically reduce the threshold on the bifurcation diagram (FIG. 11).

Another method may be to introduce a direct resonator or a non-resonating mechanical amplifier such as a lever as the first degree-of-freedom. This is option (2) as described above, and may amplify the base, or input, excitation amplitude to help it cross the threshold and thus excite a parametric resonator.

FIG. 12 is a flow chart illustrating general principles of operation of preferred embodiments of the present invention. FIG. 13 is a more detailed flow chart showing possible design routes for a parametrically-excited vibration energy harvester with reduced initiation threshold amplitude. Specific embodiments of these design routes will be described further below.

Theory and Simulation—Parametric Resonance

The employment motivation (for using parametric resonance in an energy harvester) can be summarised as, Increases power output by mechanically amplifying displacement amplitude (potentially an order higher than its direct resonator counterparts).

Broadens operational frequency bandwidth with the non-linear characteristics of its resonant peak.

Parametric excitation, unlike direct excitation, is usually perpendicular and not parallel in direction to the driving displacement. In order to achieve parametric resonance from this excitation, the excitation frequency ω needs be approximately $2\omega_0/n$; where $\omega_0$ is the natural frequency of the resonator and n is the number of order (submultiple). Therefore, the first order (principal) parametric resonance can be attained when the excitation frequency is twice the natural frequency. Additionally, there is a prerequisite of a non-zero initial displacement in order to 'push' the system out of stable equilibrium.

Apart from these requirements, the excitation amplitude needs to overcome a damping-dependent initiation threshold prior to accessing the parametric resonant region as illustrated in the bifurcation diagrams in FIGS. 1 and 11. This appears counterproductive in the context of vibration energy harvesting, since the essence of the art relies on electrically damping the mechanical resonator in order to extract electrical energy. However, once parametric resonance is activated, the oscillatory amplitude growth is not limited by linear damping and can only be saturated by either physical limits or the onset of nonlinearity.

Cantilever Resonators

A cantilever resonator is a common design choice in the art. It is able to achieve large displacements near the free end (ideal for electromagnetic and electrostatic transducers) and experience high levels of stress near the clamped end (ideal for piezoelectric transducers). Conventionally, cantilevers are driven with a direct excitation parallel to the displacement (ordinary resonance) as summarised below.

$$\ddot{x} + 2c_1\dot{x} + c_2\dot{x}|\dot{x}| + \mu x^3 + \omega_0^2 x = \frac{A}{ml}\cos(\omega t) \quad \text{(A)}$$

$$\omega_0^2 = \frac{k}{m} = \frac{3EI}{ml^3} \quad \text{(B)}$$

Where, $c_1$ is viscous damping, $c_2$ is quadratic damping, $\mu x^3$ is cubic geometric non-linearities, A is excitation displacement amplitude, k is spring stiffness, m is effective mass, l is effective beam length, E is the modulus of elasticity and I is the area moment of inertia.

When a parametric excitation is applied perpendicular to the direction of the displacement, the following equation of motion (a version of the damped Mathieu equation) can be observed.

$$\ddot{x} + 2c_1\dot{x} + c_2\dot{x}|\dot{x}| + \mu x^3 + \left(\omega_0^2 - \frac{A}{ml}\cos(\omega t)\right)x = 0 \quad \text{(C)}$$

FIG. 22 numerically (using ode45 solver in MATLAB with 'Relative tolerance' of 1E-05) contrasts the resonant peaks of a micro-cantilever when induced with either type of excitations at varying acceleration levels. While direct excitation always yields a response regardless of the excitation level, its parametric counterpart has a zero steady-state response below the initiation threshold amplitude and a small non-zero initial displacement condition is required. However, with increasing excitation amplitudes beyond this threshold, parametric resonance rapidly outperforms the fundamental mode of resonance.

Both this numerical simulation and an existing experimental study in the literature (Daqaq et al. as referred to above) have subscribed significant magnitudes to this initiation threshold amplitude; whereas in practice, the ambient vibration available for harvesting is usually very small. Recorded vibration from a Japanese railway bridge was in the order of 0.1 ms$^{-2}$. Therefore, the gap of this threshold and the base axis shown in FIG. 11 needs to be minimised in order to realistically exploit the merits of parametric resonance for this art.

Design and Fabrication

It might be possible to employ active actuators to excite a parametric resonator by overcoming the limitation of initiation threshold amplitude. However, energy harvesting cannot afford the additional power expenditures. Therefore, a passive solution to fulfil this critical criterion is highly desirable.

FIG. 12 presents proposed preferred design approaches to address this issue. The first design route employs an electrically undamped parametric resonator that is coupled with an additional electrically damped mechanical amplifier. Here, the parametric resonator has intrinsically low initiation threshold amplitude. The second design route introduces an electrically undamped mechanical amplifier prior to the electrically damped parametric resonator. In this scenario, the base vibration amplitude is amplified and brought towards the threshold for activating parametric resonance. Referring back to FIG. 11, the first approach essentially lowers the unstable region while the second approach raises the horizontal base axis.

While the parametric resonant technique theoretically promises better power and frequency responses in contrast to the conventional directly excited harvesters, initiation criteria, such as the amplitude threshold, need to be fulfilled. A passive design approach to address this has experimentally shown a reduction of this threshold by nearly 30 times. Over an order of magnitude higher power responses and approximately twice the operational frequency bandwidth have been recorded for the parametrically excited scenario in contrast to the same harvester driven at fundamental mode of resonance.

Ambient Energy Harvesting

Ambient vibrations typically include a wide range or spectrum of frequencies oscillating in a range of directions. As described above, this causes a particular problem for conventional energy harvesters using ordinary or direct resonators because of their narrow frequency response. As described herein, a parametric resonator may have a wider frequency response and therefore be able to capture vibrational energy over a wider frequency band than a direct resonator. Nevertheless, an effective energy harvester may advantageously comprise two or more parametric resonators responsive to different vibration frequencies, and/or two or more parametric resonators in different orientations in order to collect energy from a range of vibration frequencies and/or a range of vibration directions.

An energy harvester may thus comprise an array of two or more sub-units each comprising one or more parametric resonators. The sub-units or parametric resonators in such an array may be mechanically coupled so as to cover a broad operational frequency bandwidth.

DESCRIPTION OF SPECIFIC EMBODIMENTS

The principle of operation of the invention, including description of specific embodiments of the invention, will now be described in more detail with reference to the accompanying drawings in which.

Figure 2:
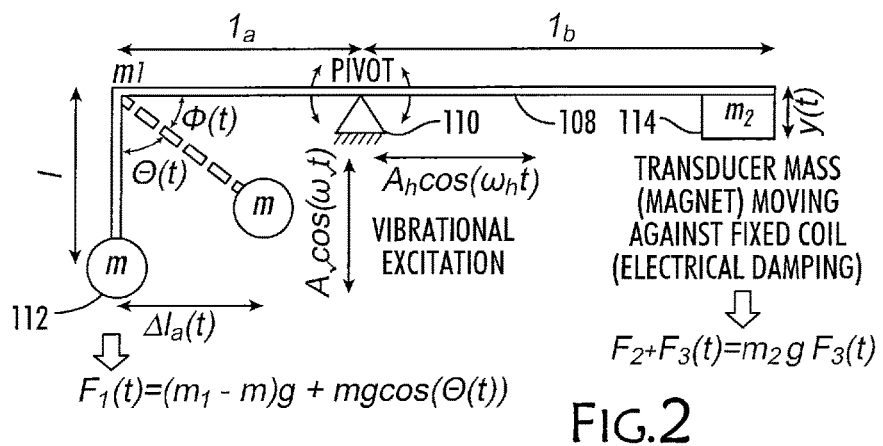
FIG. 2 is a schematic diagram of a Parametrically Excited Vibration Energy Harvester (PEVEH) embodiment. Vertical driving force yields parametric excitation.
Figure 7:
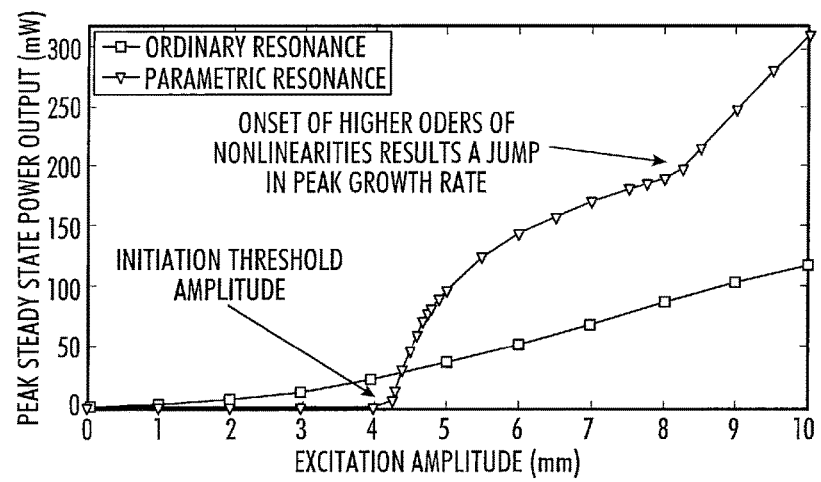
Figure 8:
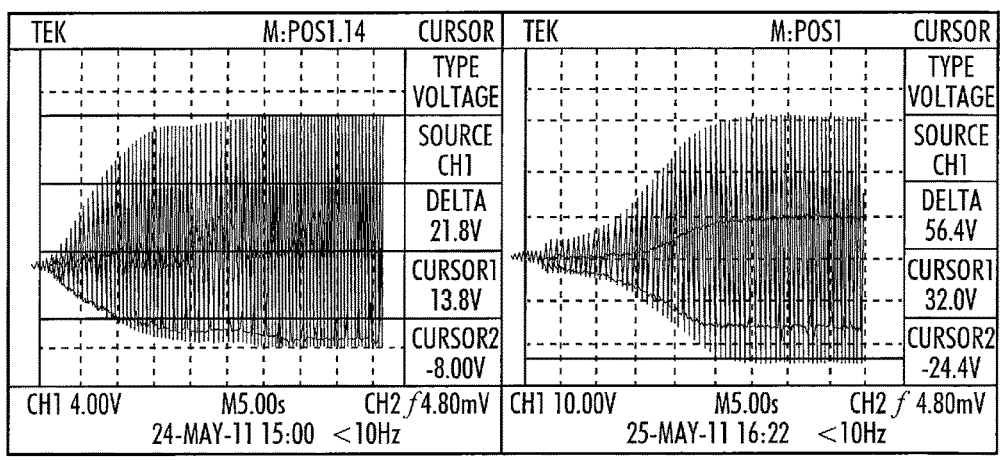
Figure 9A:
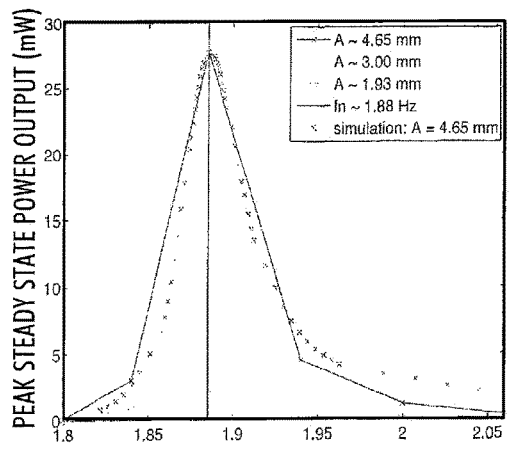
Figure 9B:
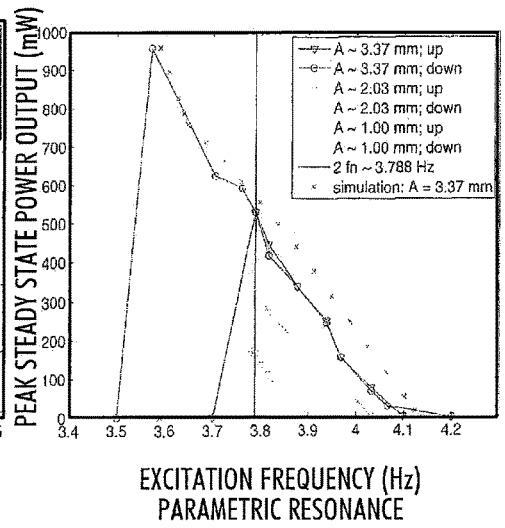
Figure 10:
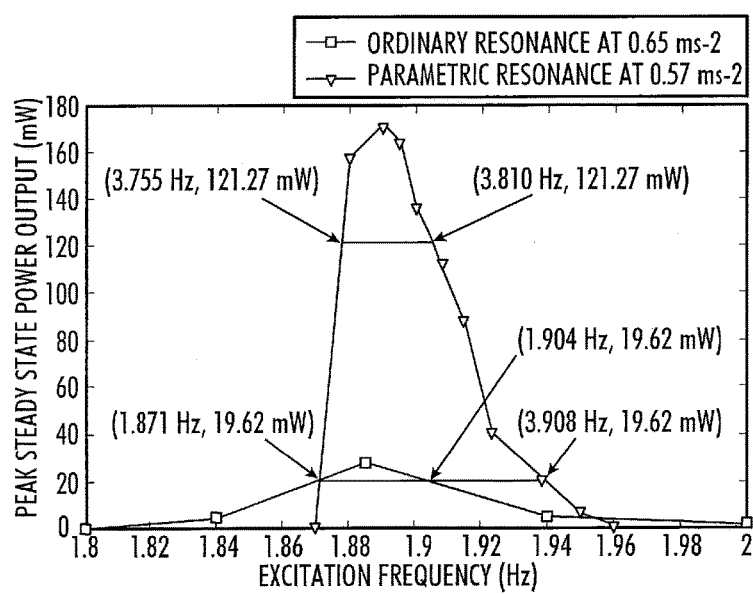
Figure 11:
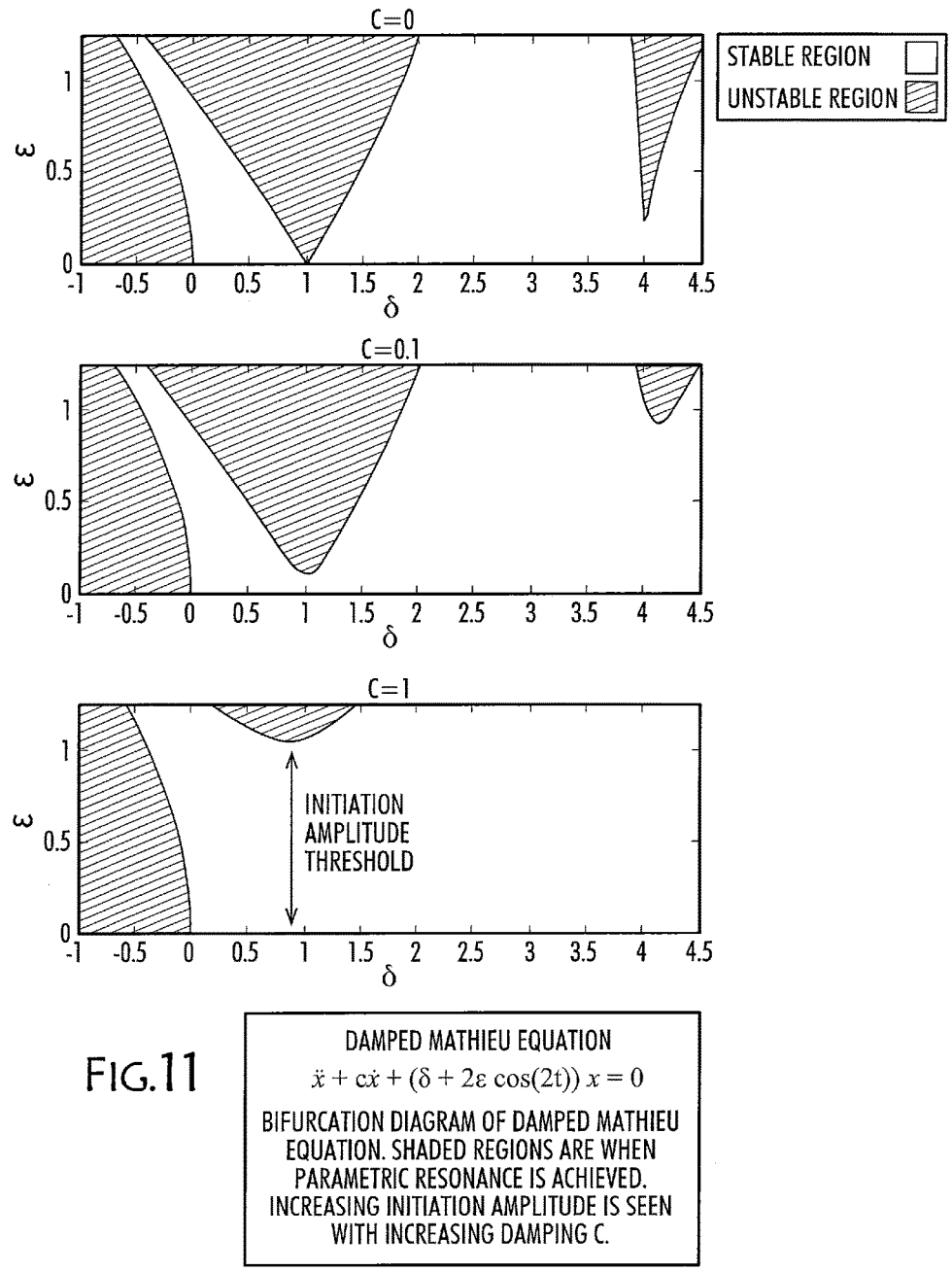
Figure 12:
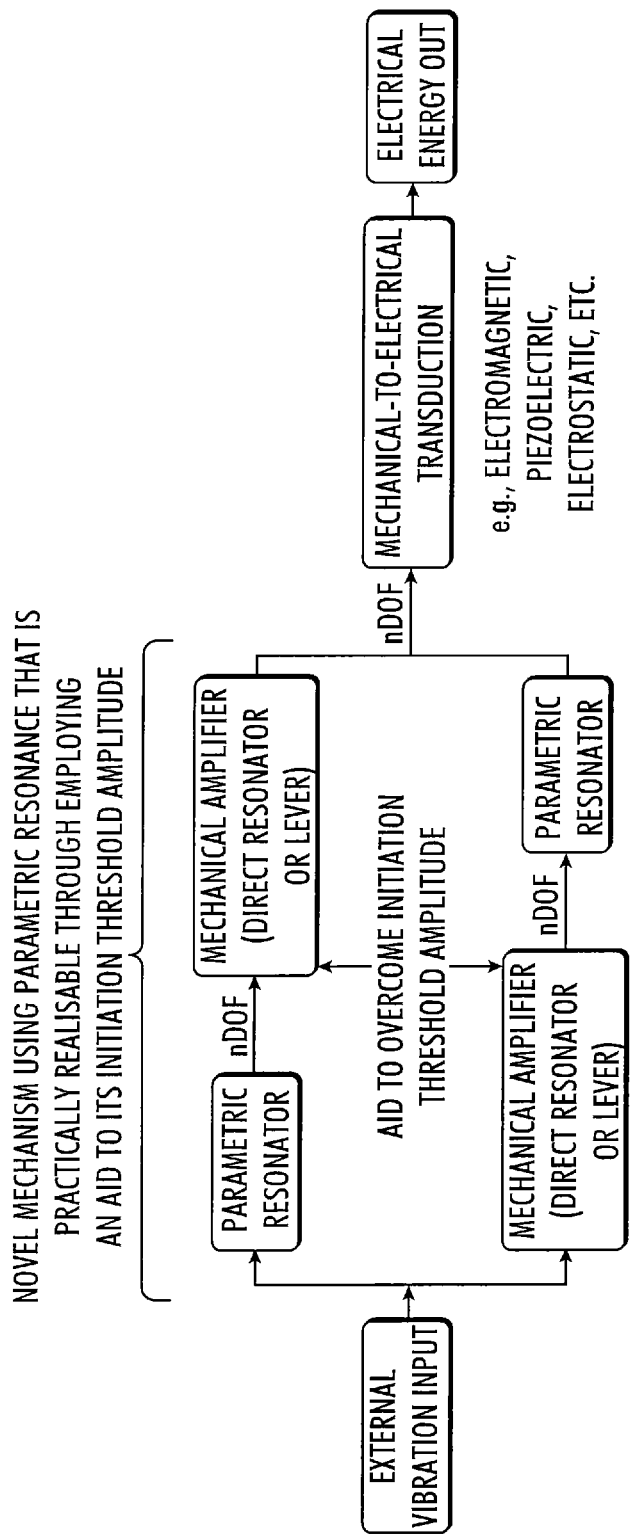
Figure 13:
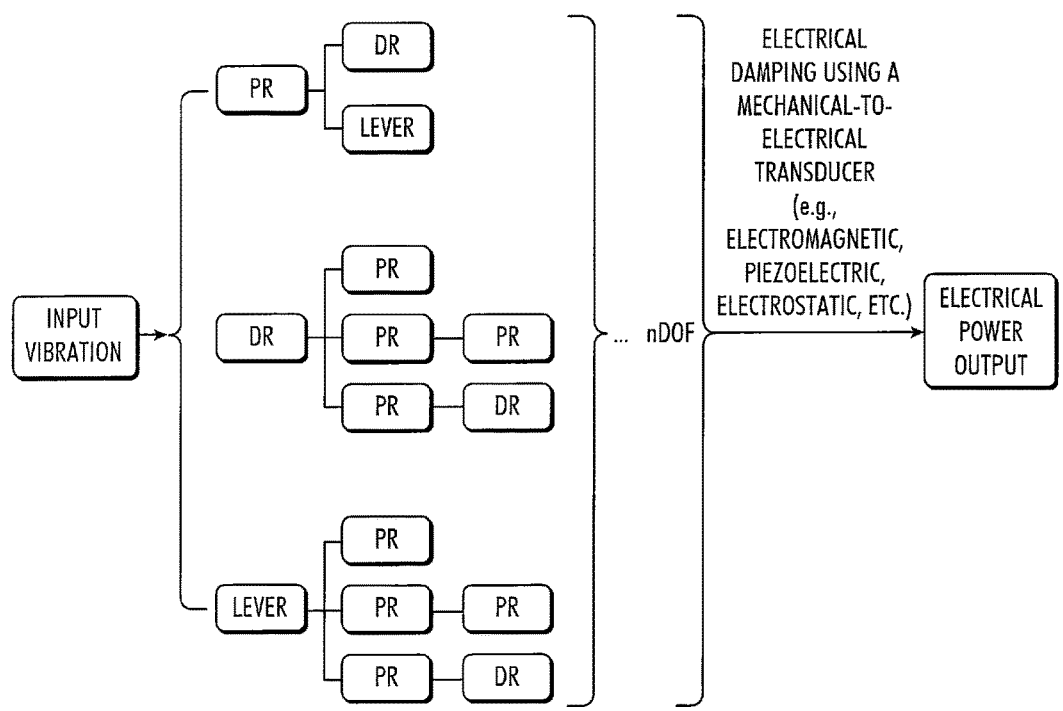
Figure 22:
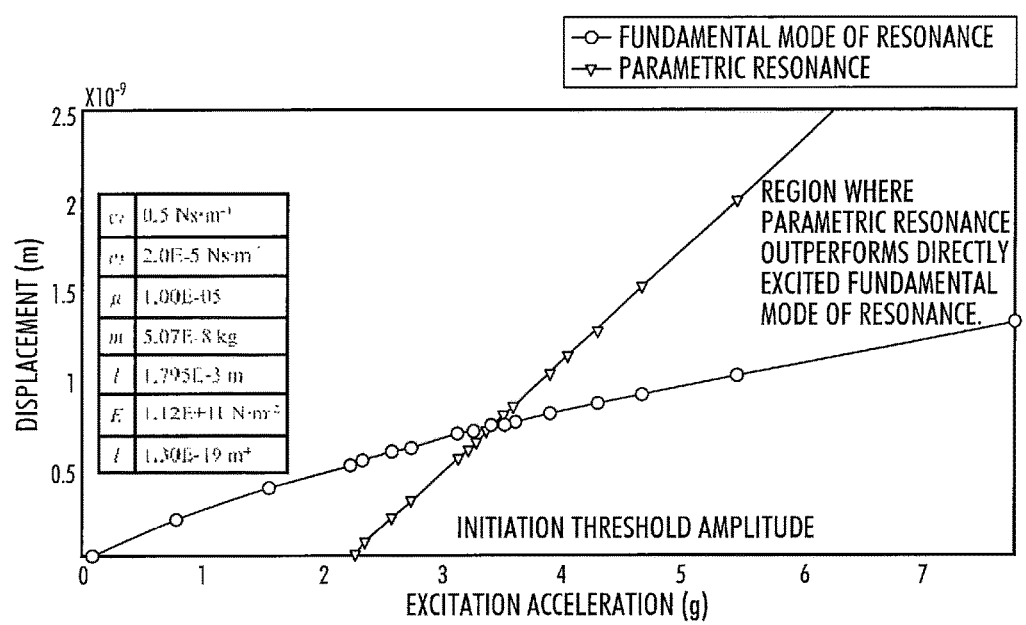
Figure 23:
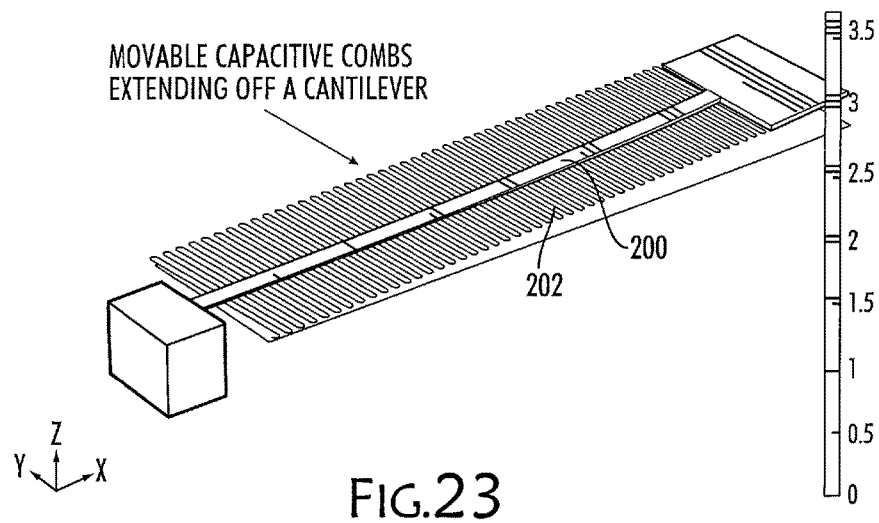
Figure 24:
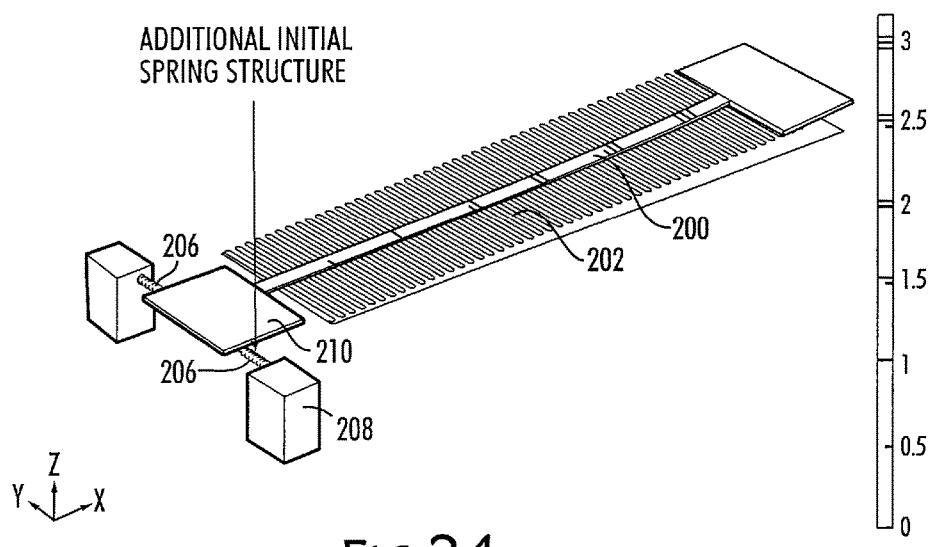
Figure 25:
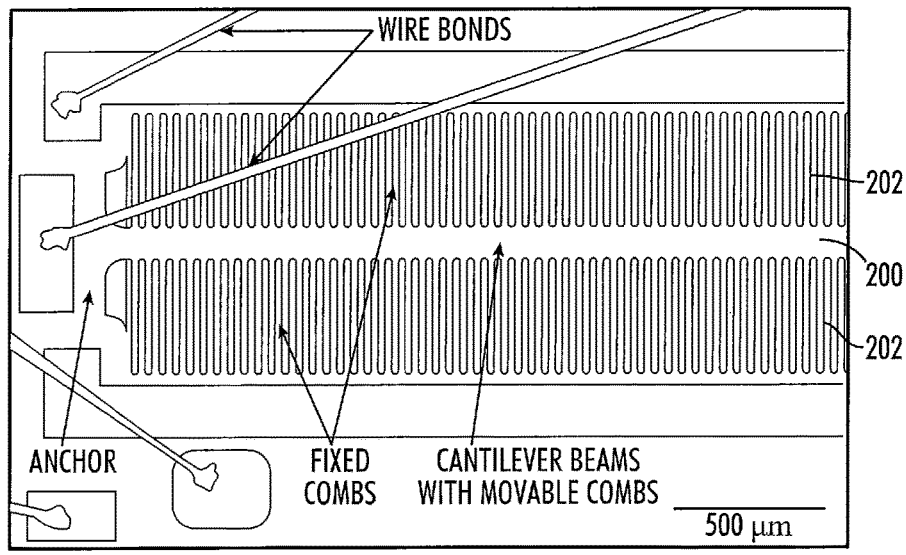
Figure 26:
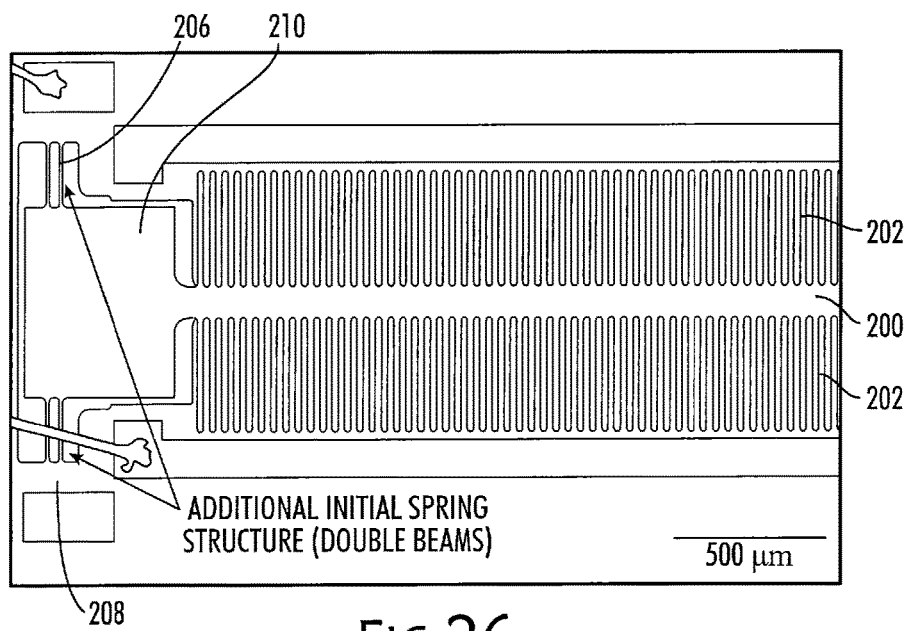
Figure 27:
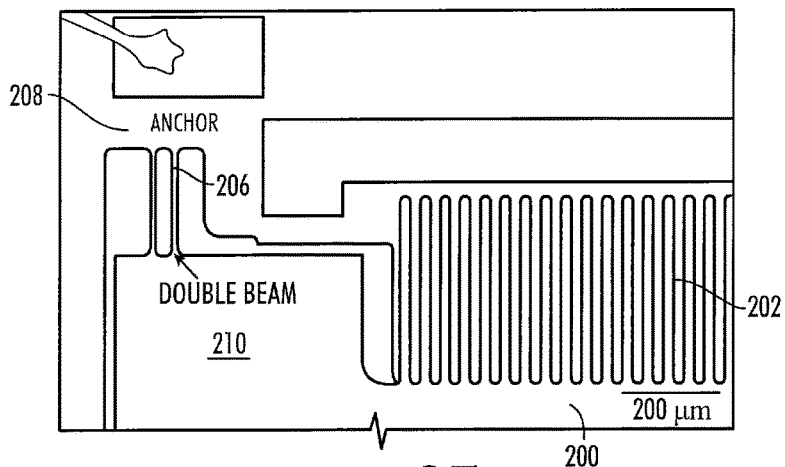
Figure 28:
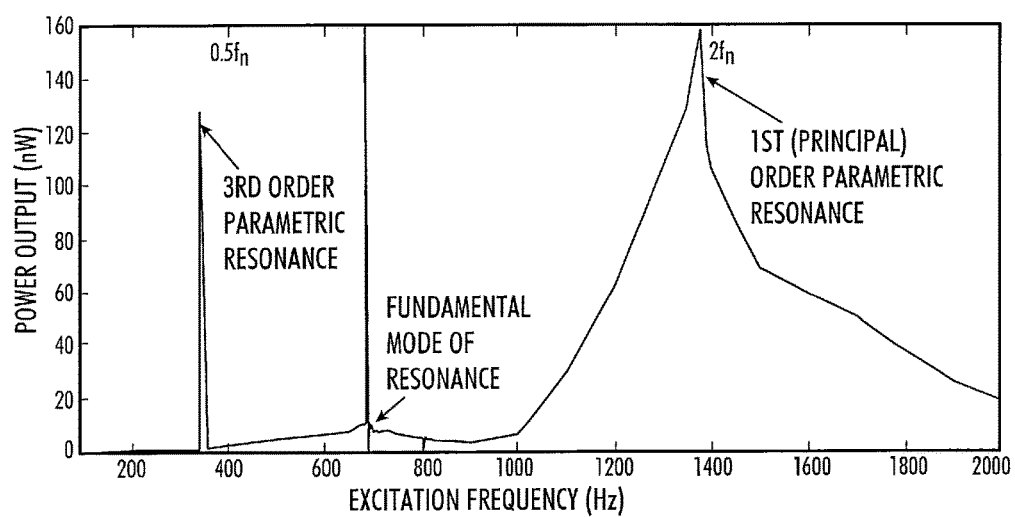
Figure 29:
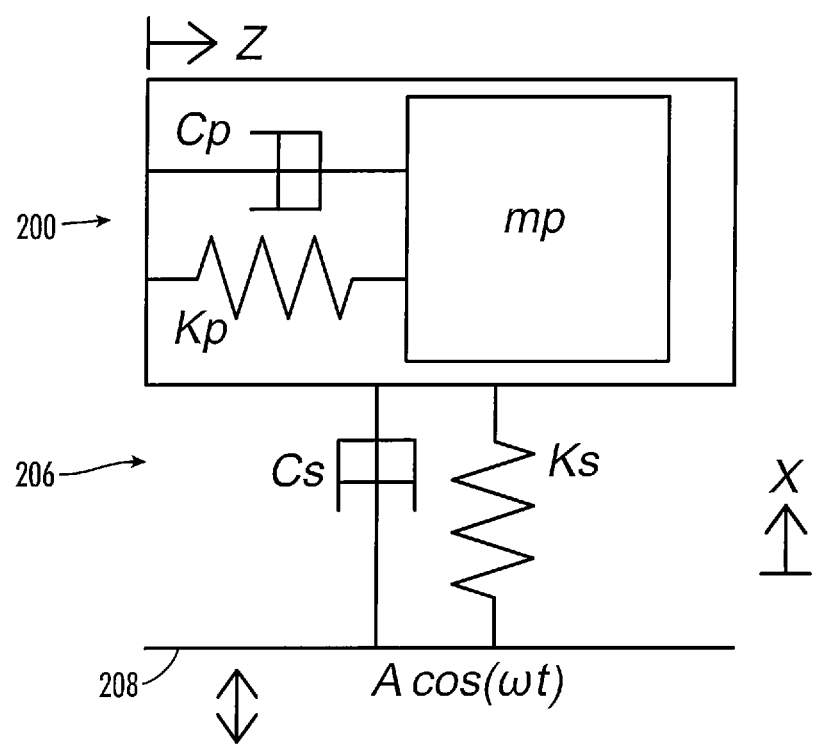
Figure 30A:
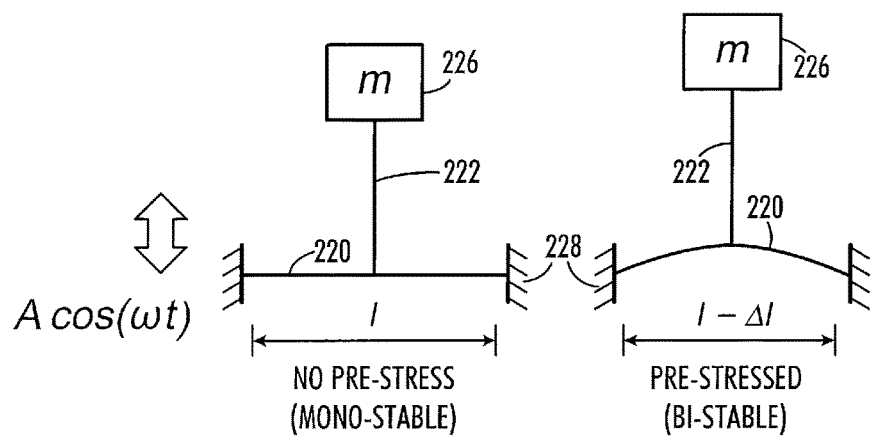
Figure 30B:
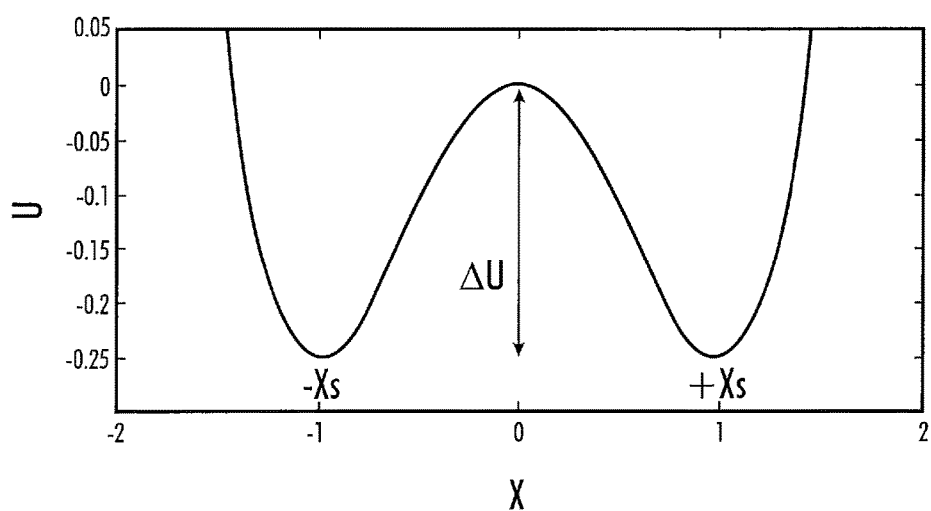
Figure 31:
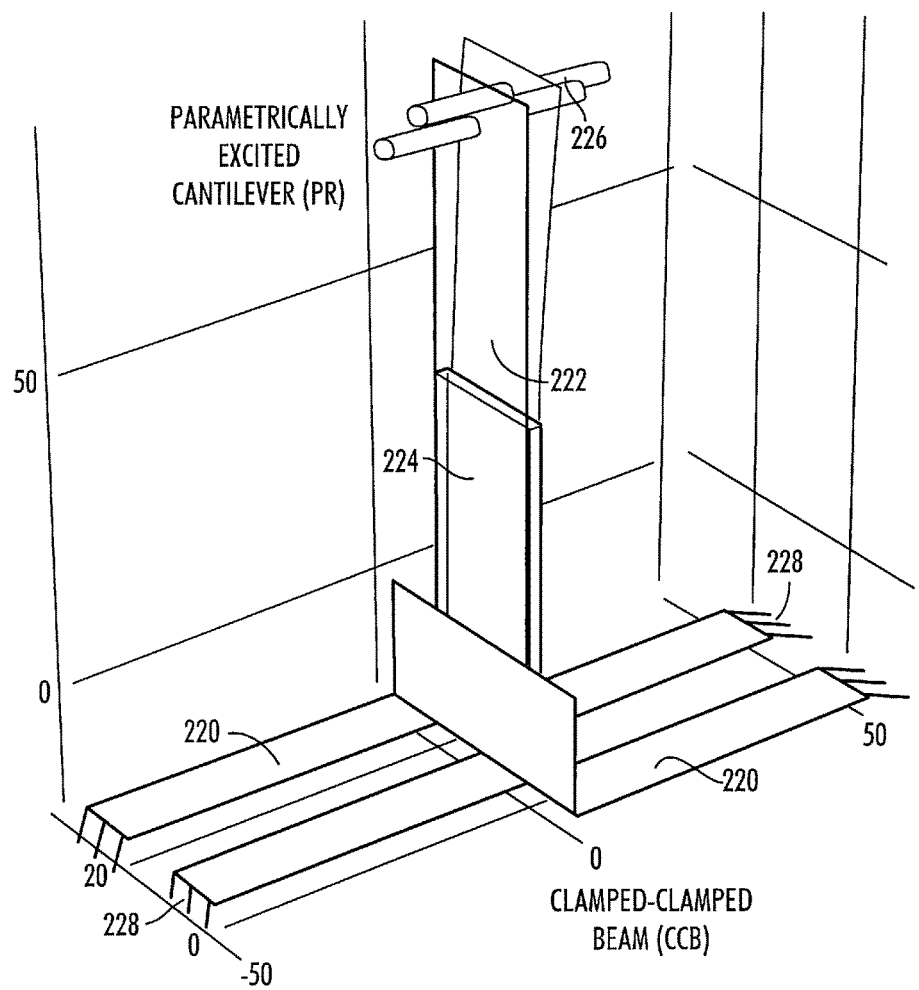
Figure 32:
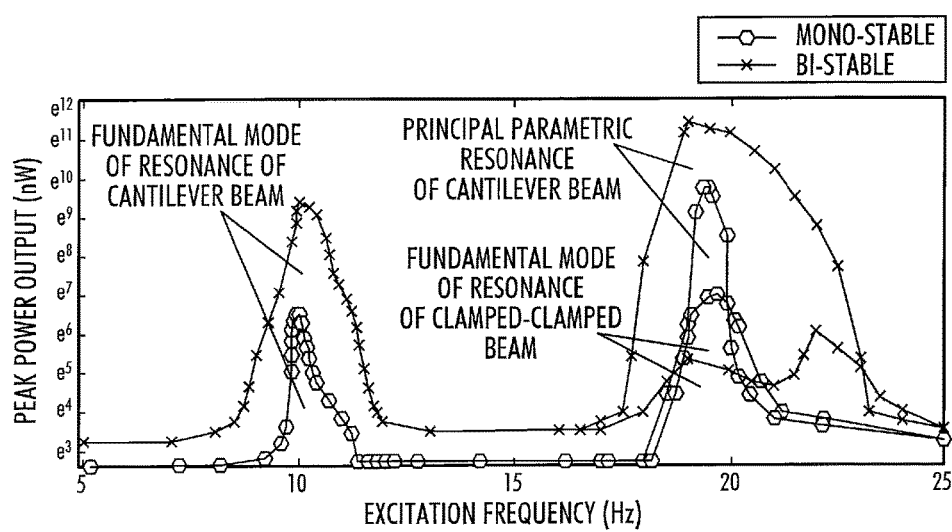
Figure 33:
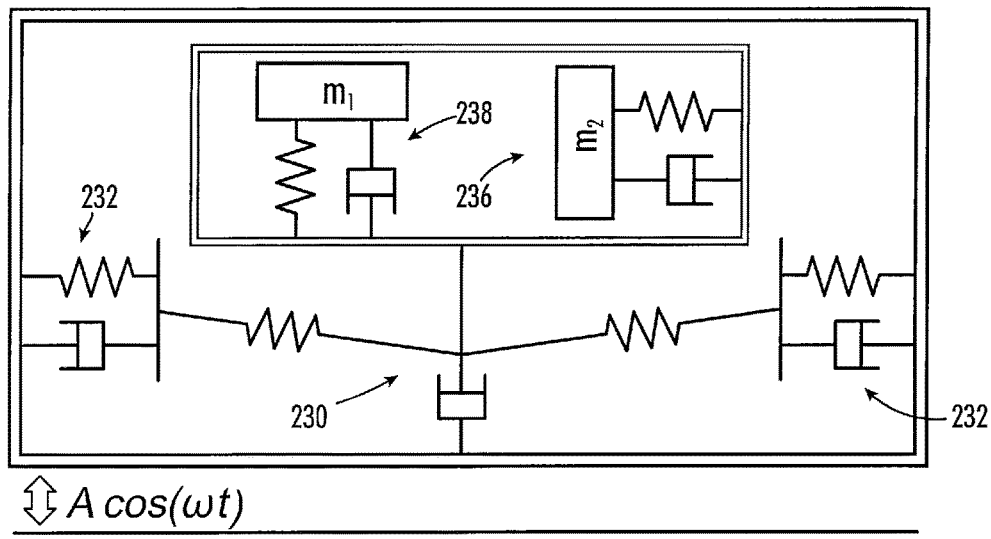
Figure 34:
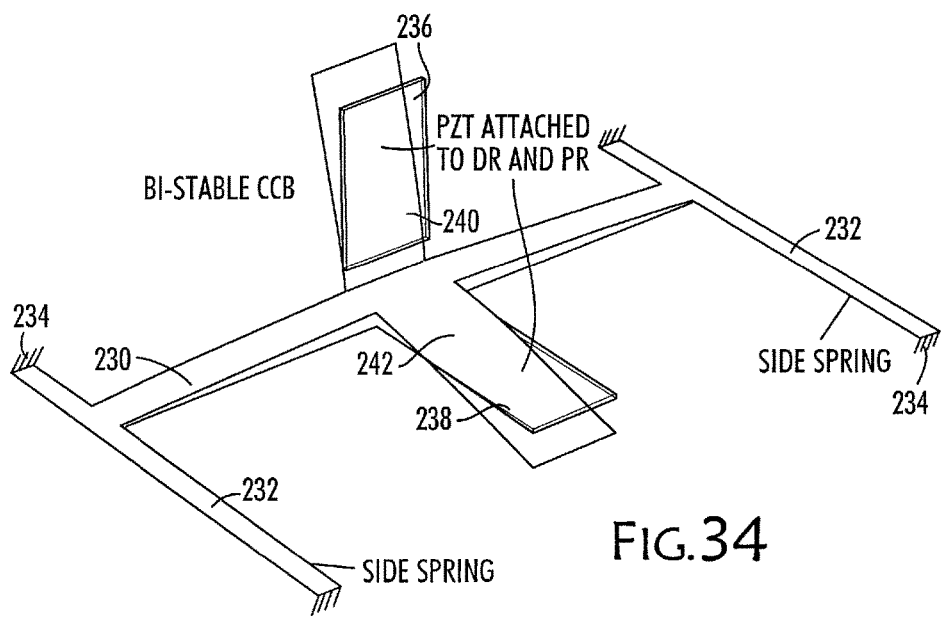
Figure 35A:
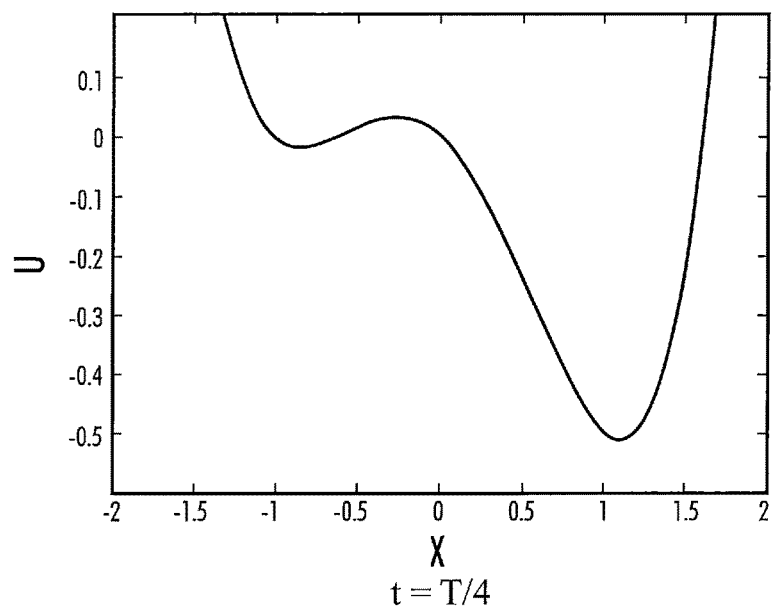
Figure 35B:
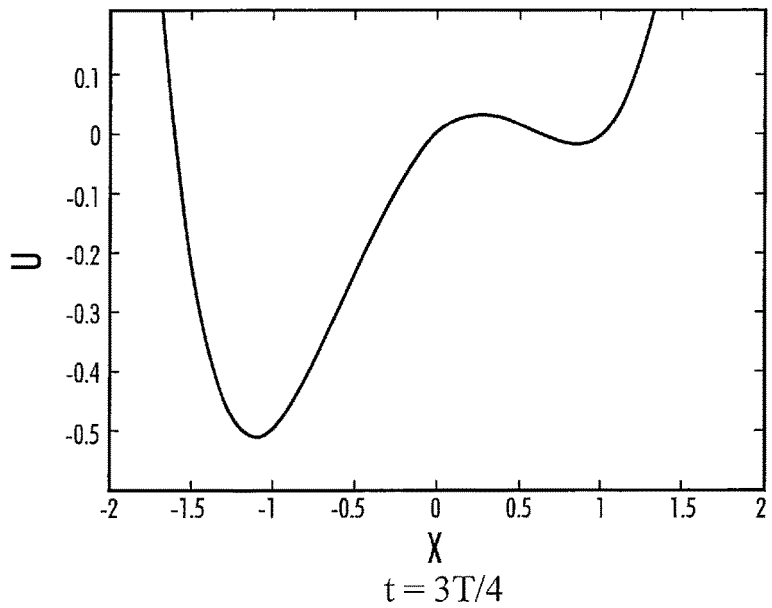
Figure 36:
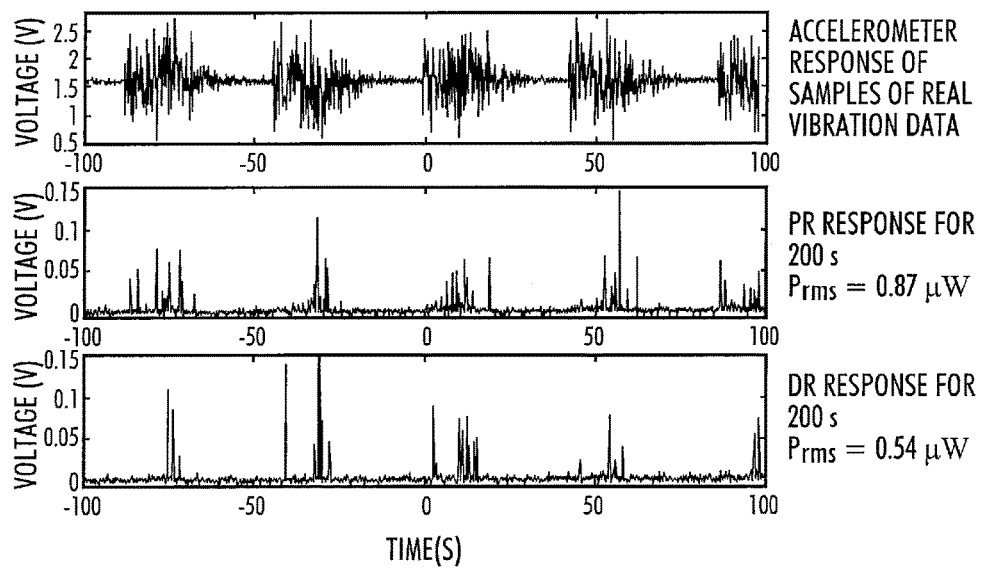
Figure 37:
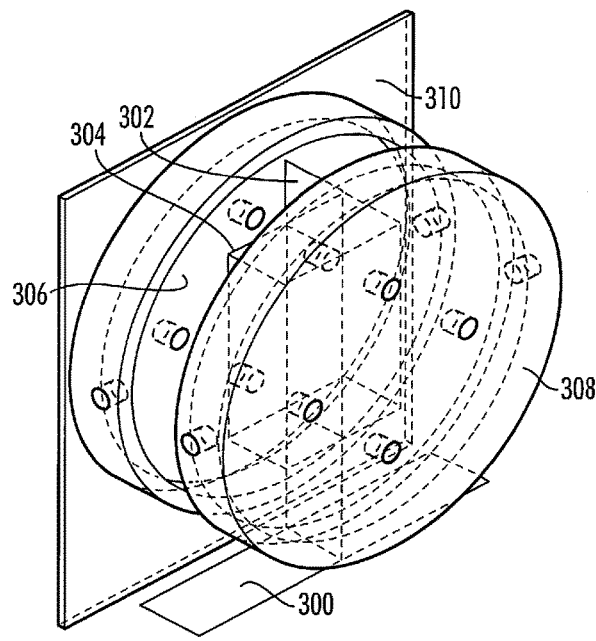
Figure 38:
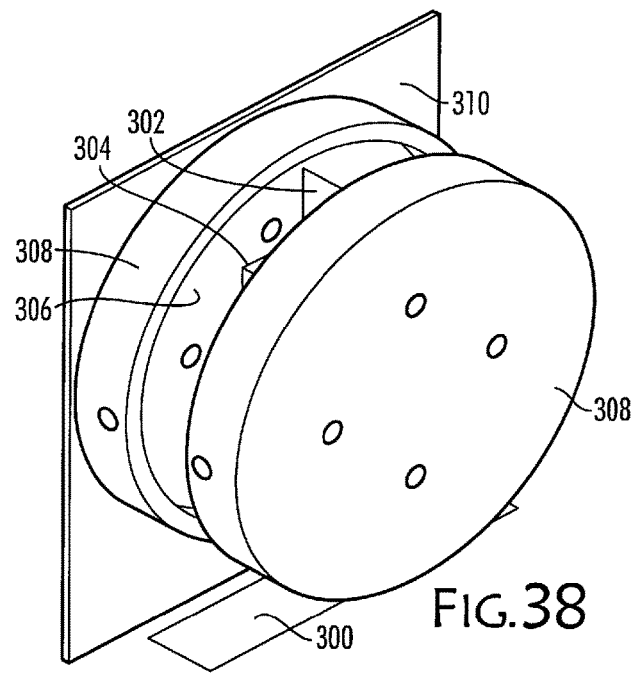
Figure 39:
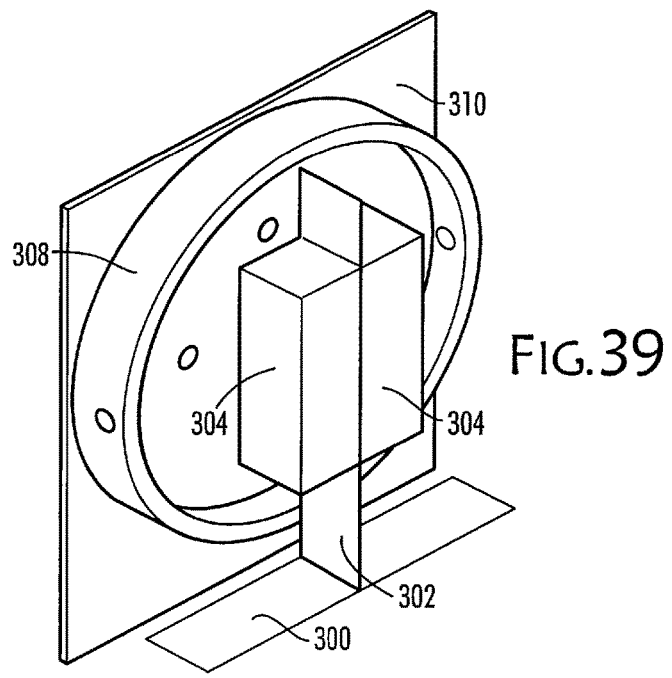

FIGS. 4 and 5 illustrate numerical simulations of the oscillatory amplitude build up (in time domain) for the embodiment of FIG. 2 near critical damping. FIG. 4 relates to excitation of ordinary resonance and FIG. 5 relates to parametric resonance. In this case, parametric resonance requires a longer time than ordinary resonance to converge to steady state;

FIGS. 6a and 6b show a comparison between a numerically-computed response for parametric resonance and ordinary resonance in the frequency domain;

FIG. 7 is a plot of peak steady-state power output against excitation amplitude, illustrating a quantitative numerical comparison between parametric and ordinary resonances' peak power response to varying excitation amplitudes;

FIG. 8 illustrates experimental measurements of experimental oscillatory amplitude build up, for the energy harvester as illustrated in FIG. 2 and having dimensions as in Table 3;

FIGS. 9(a) and 9(b) shows Bode plots of the experimental power response in the frequency domain for various excitation amplitudes A, for the energy harvester tested in FIG. 8;

FIG. 10 illustrates experimental frequency bandwidth and extractable power of parametric resonance (frequency scale halved for the purpose of comparison) and ordinary resonance at comparable accelerations (~0.6 $ms^{-2}$), for the energy harvester tested in FIGS. 8 and 9;

FIG. 11 shows the effect of damping on the initiation amplitude threshold of a parametric resonator, in a bifurcation diagram of the damped Mathieu equation. Shaded regions are when parametric resonance is achieved. Increasing initiation amplitude is seen with increasing damping c;

FIG. 12 is flow chart outlining preferred design principles for constructing energy harvesters incorporating aspects of the present invention. These are design approaches to passively minimise initiation threshold amplitude. In the figure, 'Additional mechanical amplifiers' encompasses direct and parametric resonators as well as non-resonating amplifiers such as levers; and 'n DOF' is n degrees-of-freedom (n=0, 1, 2 . . . );

FIG. 13 is a more detailed flow chart than FIG. 12, summarising possible design routes for a parametrically-excited vibration energy harvester with aids to reduce, or solve the problem of, initiation threshold amplitude;

FIGS. 14 to 21 illustrate different energy harvester structures embodying design routes set out in FIGS. 12 and 13;

FIG. 22 is a graph showing a numerical comparison of the steady-state resonant peaks between direct and parametric excitations at various excitation acceleration levels;

FIGS. 23 and 24 show COMSOL designs of two MEMS cantilevers. Direct excitation equates to out-of-plane driving force, whereas an in-plane excitation can potentially induce parametric resonance in FIG. 23 and auto-parametric resonance in FIG. 24. Capacitive comb fingers extend off the cantilever beam. Accompanying fixed comb fingers are not shown here;

FIGS. 25 and 26 show SOIMUMPS realisations of the parametrically and auto-parametrically excitable MEMS designs illustrated in FIGS. 23 and 24 respectively;

FIG. 27 is an enlarged view of the double-beam support for the cantilever resonator of FIGS. 24 and 26;

FIG. 28 is a graph showing experimental power response of auto-parametric harvester at input acceleration of 4.2 $ms^{-2}$. 1st and 3rd order parametric resonances can be seen at twice and half of the natural frequency $f_n$ respectively;

FIG. 29 is a diagram showing a mass-spring-damper equivalent of the energy harvester design of FIGS. 24, 26 and 27;

FIG. 30 shows at 30(a) schematic diagrams of embodiments of the invention comprising a parametric resonator supported on a beam (a direct resonator) clamped or anchored at both ends, in an unstressed state and in a pre-stressed, bi-stable state, and at 30(b) a graph showing the bi-stability of the beam;

FIG. 31 illustrates a primarily parametrically excited cantilever coupled to a clamped-clamped beam, as illustrated schematically in FIG. 30;

FIG. 32 shows an experimentally-measured power spectrum for the embodiment shown in FIG. 31, with and without bi-stability induced by pre-stressing the beam;

FIG. 33 is a model view of an embodiment of the invention comprising a directly and parametrically excited bi-stable resonator with side springs;

FIG. 34 illustrates an energy harvester of the type shown in FIG. 33. With vertical excitation, the vertical cantilever acts as PR (parametric resonator) and horizontal cantilever acts as DR (direct resonator). Both subsidiary resonators rest on a pre-stressed bi-stable CCB (clamped-clamped beam). The two side springs aid the modulation of the potential barrier and increase the probability of snapthrough;

FIG. 35 presents graphs showing a representative modulation in the height of the potential barrier for the bi-stable system with side-springs, enabling a higher probability of hopping over to the neighbouring potential intra-well. The parameter T is the time period associated with the modulation;

FIG. 36 shows experimentally recorded voltage response of the prototype shown in FIG. 34 to an amplified sample of real vibration data;

FIG. 37 shows a perspective view of an energy harvester, with its front mounting plate omitted for clarity;

FIG. 38 shows a view corresponding to FIG. 37 but showing details in phantom; and FIG. 39 shows a view of the internal structure of the energy harvester of FIGS. 37 and 38.

In the arena of vibration energy harvesting, the key technical challenges continue to be the low power density and narrow operational frequency bandwidth of existing designs. While convention has relied upon the activation of the fundamental mode of resonance (of a direct resonator) through direct excitation, this invention may advantageously provide or enable a new paradigm through the employment of parametric resonance for energy harvesting. Unlike direct resonance, oscillatory amplitude growth in parametric resonance does not converge to steady state due to linear damping. Therefore, the power output of an energy harvester employing parametric resonance may accumulate to higher levels. Additionally, it is the onset of non-linearity that eventually limits parametric resonance; hence, this approach can also potentially broaden the operating frequency range. The inventors' theoretical prediction and numerical modelling have suggested that an order of magnitude higher in oscillatory amplitude growth may be achievable.

In the inventors' initial experiments, a macro-sized electromagnetic prototype (practical volume ~1,800 cm$^3$) was built and tested. This device is illustrated in FIG. 2 and described in more detail below. When parametrically driven, this device has demonstrated around 67% increase in half-power band and an order of magnitude higher peak power density normalised against input acceleration squared (293 $\mu$Wcm$^{-3}$m$^{-2}$s$^4$ with 171.5 mW at 0.57 ms$^{-2}$) in contrast to the same prototype directly driven at fundamental (ordinary, or direct) resonance (36.5 $\mu$WcmM$^{-3}$m$^{-2}$s$^4$ with 27.5 mW at 0.65 ms$^{-2}$). This figure suggests promising potential compared with current state-of-the-art macro-sized counterparts, such as Perpetuum's PMG-17 (119 $\mu$Wcm$^{-3}$m$^{-2}$s$^4$).

In the past decade, energy harvesting has witnessed a rapid increase of interest from both academia and industry. In contrast to the top-down process of conventional power generation, the decentralised and self-sustaining nature of energy harvesting provides a convenient onboard complement to batteries for prolonged lifetime of remote and wireless devices.

Solar power has already emerged as a relatively mature technology for decentralised power generation; however, it is not suitable for enclosed or embedded applications where luminosity is scarce. On the other hand, ambient kinetic vibration is observed in a wide variety of applications; from rails to bridges, industrial compressors to turbine engines and walkways to human motions. Therefore, it is a popular energy source to harness in order to power and sustain wireless sensor nodes, for example for structural health monitoring.

Most conventional vibration harvesters rely on the activation of a fundamental mode of resonance through direct excitation of a second order mass-spring-damper system where the driving force is applied parallel to the direction of the oscillatory displacement. The fundamental mode of resonance is attained when the exitation frequency matches the resonant frequency of the system. This type of resonance, achieved through direct excitation, is also termed 'ordinary resonance'.

Two major persisting technical challenges of this emerging technology are the small power density and narrow operational frequency bandwidth. Due to the random and continuously varying nature of real world vibrational sources, an ideal harvester should be able to function over a wide range of frequencies. However, designing a system with a flatter resonant response through damping tuning, compromises the peak power achievable. Therefore, the ideal objective is to maximise both the peak power and the frequency bandwidth.

In an attempt to resolve this dilemma, embodiments of the invention employ parametric resonance (a type of self-excited nonlinear vibration) as a means of mechanical amplification while exploiting its nonlinear resonant characteristics to widen the frequency band. This particular resonant phenomenon is induced when an external excitation results in a periodic modulation of an internal system parameter. In contrast to ordinary resonance, the driving force is usually applied perpendicular to the oscillatory displacement.

As described above, this approach suffers a significant problem, namely the requirement for the excitation amplitude to exceed a certain initiation threshold prior to accessing the parametric resonant regime. Embodiments of the invention aim to overcome the shortcomings of a parametrically excited vibration energy harvester (PEVEH) to achieve a practical realisation of this type of device.

Parametric resonance is distinct from most vibrational resonances due to a self-excited instability phenomenon. There are two classifications: heteroparametric resonance (which is simply referred to as parametric resonance in modern academia) and autoparametric resonance. Heteroparametric excitation is induced by the periodic modulation of certain system parameters in response to an external force. Autoparametric resonance arises from certain integer ratio relationships among the various natural frequencies of a multiple degree-of-freedom system, resulting in one oscillating component of the system introducing a periodic modulation of the system parameter on a second oscillator. Embodiments of the invention may employ either form of parametric resonance.

Table 1 summarises the advantages of parametric resonance over the current paradigm of vibration energy harvesting using ordinary resonance. Unlike ordinary resonance, oscillatory amplitude growth due to parametric resonance, governed by the generic undamped Mathieu equation (equation 1 below), does not converge to a steady state by linear damping and can only be limited by either physical limits or the onset of non-linearity at high amplitudes. This rise of nonlinearity can further aid the widening of the frequency band within which a parametric resonator can operate, therefore fulfilling the two following objectives simultaneously.

Using parametric resonance as a means of mechanical amplification to maximise the power peak.

Using its nonlinear resonant peak to broaden the operational frequency bandwidth.

TABLE 1

Motivation for employing parametric resonance over ordinary resonance. Energy invested $E_{in}$, by the former is directly proportional to energy dissipation by linear damping $E_{lost}$ while in the latter it is proportional to $\sqrt{E_{lost}}$. Therefore, theory predicts an order higher in oscillatory amplitude growth over ordinary resonance.

| | Directly proportional to, $\propto$ | | |
|---|---|---|---|
| Energy input $E_{in}$ | Amplitude growth | Energy stored | Energy dissipated by linear damping |
| Ordinary | A | $\sqrt{E_{stored}}$ | $\sqrt{E_{lost}}$ |
| Parametric | A$^2$ | $E_{stored}$ | $E_{lost}$ |

From the undamped Mathieu equation (equation 1);

$$\ddot{x}+(\delta+2\epsilon \cos(2t))x=0 \quad (1)$$

Figure 1:
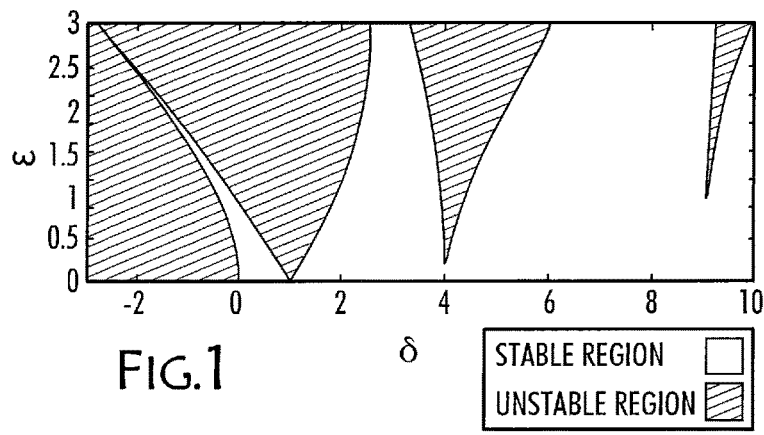
FIG. 1 is a graph showing stable (unshaded) and unstable (shaded) regions in the δ-ε parameter plane of the Mathieu equation (numerically generated). The unstable region signifies the achievement of parametric resonance.

$\delta$ and $\epsilon$ are generic parameters whose values determine the stability of the system, and t is time. When displacement x has unbounded solutions, an exponential build up of oscillatory amplitude can be achieved. This amplitude growth can theoretically approach infinity in a purely linear setting and is represented by the unstable region (shaded) in the bifurcation diagram shown in FIG. 1. The first order or the principal parametric resonance, which is usually observed at double the natural frequency of a periodically excited system (as presented below), exhibits the largest unstable region.

One of the main hindrance factors, in a damped scenario (i.e. for a damped parametric resonator), is the requirement for the excitation amplitude to exceed a certain threshold amplitude before overcoming initial damping; as experienced and reported by Daqaq et al. Otherwise, the system would be trapped within a stable equilibrium. The exact threshold amplitude required depends on the working mechanism of the specific system. Additionally, an initial non-zero displacement is also required to 'push' the system out of stable equilibrium.

The design schematic in FIG. 2 presents a macro-scale Parametrically Excited Vibration Energy Harvester (PE-VEH) prototype. Parametric excitation can be observed in a variety of systems depending on the precise excitation criteria. FIG. 2 shows one such system in which a pendulum 112 is suspended on the left-hand-end of a lever beam 108 which is, when the pendulum is at rest, balanced on a pivot 110 secured to a base (not shown). At the right-hand-end of the beam a transducer 114 is mounted. This comprises a magnet secured to the beam, movable within fixed coils (not shown) when the lever beam tilts about the pivot. Electrical energy can then be extracted from the coils. This system, can be directly and/or parametrically driven as illustrated in FIG. 2. Propagation of vibration from the anchored base, via the pivot, drives the pendulum with angular displacement $\theta(t)$. The lever mechanism enables further mechanical amplification on the transducer side with vertical displacement $y(t)$, (assuming small arc angle). In the absence of vibration, the lever beam 108 balances so that it remains horizontal. Applying a horizontal driving oscillation ($A_h \cos \omega_h t$) to the pivot 110, and thus to the pendulum 112, equates to direct excitation, which allows the activation of ordinary resonance when $\omega_1$, equals the pendulum's natural frequency $\omega_0$. Vertically driving the pivot, and thus the pendulum, ($A_h \cos \omega_v t$) is parametric excitation and can activate parametric resonance of the pendulum when $\omega_v \approx 2\omega_0$. Displacement of the lever induced by pendulum motion is further mechanically amplified on the transducer side by the lever, so that electrical energy can be drawn from the transducer.

The principal damping (transducer's electrical damping) does not directly act on the pendulum. Therefore, the initiation amplitude threshold required to activate parametric resonance is lower than in a design where the pendulum mass is primarily, or directly, damped.

Horizontally driving a pendulum at its suspension (by horizontal oscillation of the pivot) induces a direct excitation governed by equation 2.

$$\ddot{\theta} + c\dot{\theta} + \omega_0^2 \sin\theta = \omega_h^2 \frac{A_h}{l} + \cos(\omega_h t) \quad (2)$$

Where $\theta$ is the angular displacement of the pendulum, $\omega_0$ is the angular natural frequency of the pendulum, $\omega_h$ is the horizontal excitation angular frequency, $A_h$ is the horizontal excitation displacement amplitude, c is the pendulum damping coefficient, l is the pendulum arm length and t is the time domain. With a vertical driving force, parametrically driving the pendulum, equation 3 governs the system's motion. The presence of a time-varying coefficient implies that this is a damped Mathieu equation and parametric excitation can be initiated.

$$\ddot{\theta} + c\dot{\theta} + \left(\omega_0^2 + \omega_v^2 \frac{A_v}{l} + \cos(\omega_v t)\right)\sin\theta = 0 \quad (3)$$

Where $\omega_v$ is the vertical excitation angular frequency and $A_v$ is the vertical excitation displacement amplitude. Equation 4 becomes the governing equation when both horizontal (direct) and vertical (parametric) excitations are present.

$$\ddot{\theta} + c\dot{\theta} + \left(\omega_0^2 + \omega_v^2 \frac{A_v}{l} + \cos(\omega_v t)\right)\sin\theta = \omega_h^2 \frac{A_h}{l} + \sin(\omega_h t) \quad (4)$$

Ordinary resonance in equations 2 and 4 can be attained when $\omega_h = \omega_0$. Parametric resonance in equations 3 and 4 can be achieved when $\omega_v = 2\omega_0/n$ where n is the order number. Principal parametric resonance is observed when n=1.

The core mechanism of the harvester shown in FIG. 2 involves the propagation of vibrational excitation in a vertical direction along the system support (the pivot and the balanced lever) to drive the pendulum parametrically at its suspension. When angular displacement $\theta(t)$ of the pendulum is non-zero, the lever beam 108 (acting as an additional mechanical amplifier) is unbalanced and drives the transducer in the vertical direction. $F_1(t)$ is the force exerted by the weight of pendulum, $F_2$ is the weight of the transducer side and $F_3(t)$ is the force acting on the lever beam due to the electrical damping of the transducer.

The equilibrium equations describing the lever beam balanced at rest (t=0 and $\theta$=0) is given by equation 5.

$F_1(t)l_a(t)=F_2 l_b$ where, $F_1(t)=(m_1-m)g+mg\cos(\theta(t))$ and, $F_1(0)=(m_1-m)g+mg\cos(0)=m_1 g$ also, $F_2=m_2 g$ therefore, $m_1 g l_a(0)=m_1 g l_b$ \quad (5)

Where m is the pendulum mass, $m_1$ is the total mass of the pendulum side, $m_2$ is the total mass of the transducer side, $l_a(t)$ is the active length between the pendulum's centre of mass and the pivot, $l_a(0)$ is the constant parameter of original $l_a$ at rest, $l_b$ is the active length between the transducer side's centre of mass and the pivot, and g is the acceleration due to gravity. Under dynamic response, $l_a(t)$ is represented by equation 6 and unbalance is induced in the lever beam.

$l_a(t)=l_a(0)-\text{sgn}(\theta(t))\Delta l_a(t)$ where, $\Delta l_a(t)=l\cos(\emptyset(t))$ \quad (6)

Where, $\Delta l_a(t)$ is the change in active length $l_a(t)$ when the pendulum is in motion and $\emptyset=0.5\pi-\theta$. As the lever beam rocks about the pivot as a function of time, the transducer side mass (magnet) 114 moves against the closely placed fixed coils with displacement $y(t)$. For $l_b \gg y(t)$, small arc angle can be assumed and $y(t)$ can be approximated as simple vertical displacement. The mechanical work done against the electrical damping of the transducer and the electrical power extractable from the system can be estimated by the dynamic forces about the lever beam. Therefore, the governing equation of the system sums up to the following.

$((m_1-m)g+mg\cos(\theta(t)))(l_a(t)=l_b(m_2 g+F_3(t))$ \quad (7)

The $F_3(t)$ term here is assumed to be approximately equal to the mechanical force from the torque caused due to imbalance in the lever when θ is non-zero. This assumption is true for an ideal transducer where conservation of energy holds during mechanical-to-electrical power conversion, while taking into account the various damping terms.

For an electromagnetic transducer, displacement is related to electrical power output $P_{elec}$ by a squared relationship; that is $\theta^2 \propto y^2 \propto P_{elec}$. An estimate of the theoretical maximum electrical power output achievable $P_{maxelec}$, under ideal electrical load conditions (when electrical damping $D_e$ equals parasitic damping $D_p$) is assumed in equation 8.

$$P_{maxelec} \approx \frac{(m'a')^2}{8D_p} \quad (8)$$

Where, m' is a generic mass and a' is the time-varying-acceleration of this mass. The generic m'a' term from this equation is the mechanical force experienced by an ideal electromagnetic transducer. Therefore, $F_3$ and an estimate of the maximum electrical power output can be calculated by substituting this term back into equation 7 to obtain the θ(t) dependent power output relationship in equation 9. θ(t) itself is determined by one of the equations 2 to 4, depending on the excitation criteria.

$$P_{maxelec}(t) \approx \frac{1}{8D_p}\left(\frac{((m_1-m)g + mg\cos(\theta(t)))(l_a(t))}{l_b} - m_2 g\right)^2 \quad (9)$$

The actual amount of maximum power extractable at the load ($P_{maxload}$) also depends on the resistive loading conditions and the electrical damping ($D_e$) of the electromagnetic transduction as defined in equations 10 and 11 respectively. Where, $R_{load}$ is the resistive load, $R_{coil}$ is the resistance of the coil, N number of coil turns, $l_{coil}$ is the length of the coil, B is the flux density, $L_{coil}$ is the inductance of the coil. The imaginary component of equation 11 can be neglected for frequency <1 kHz.

$$P_{maxload} = P_{maxelec} \frac{R_{load}}{R_{load} + R_{coil}} \quad (10)$$

$$D_e = \frac{(Nl_{coil}B)^2}{R_{load} + R_{coil} + j\omega L_{coil}} \quad (11)$$

While $D_e$ directly resists y(t), it also has a fractional effect on θ(t) as it restricts the dynamic motion of the lever. The actual efficiency of the system and the transducer as well as additional nonlinear damping factors further reduce the maximum power estimated above. Therefore, various fitted numerical factors (either constants or functions of displacements) are required as coefficients for variables such as $F_3(t)$, $D_p$, $D_e$ and the feedback damping from $D_e$ to the pendulum damping in order for the numerical model to provide a more realistic estimate and to match with the experimental model.

Numerical Simulation

Figure 3:
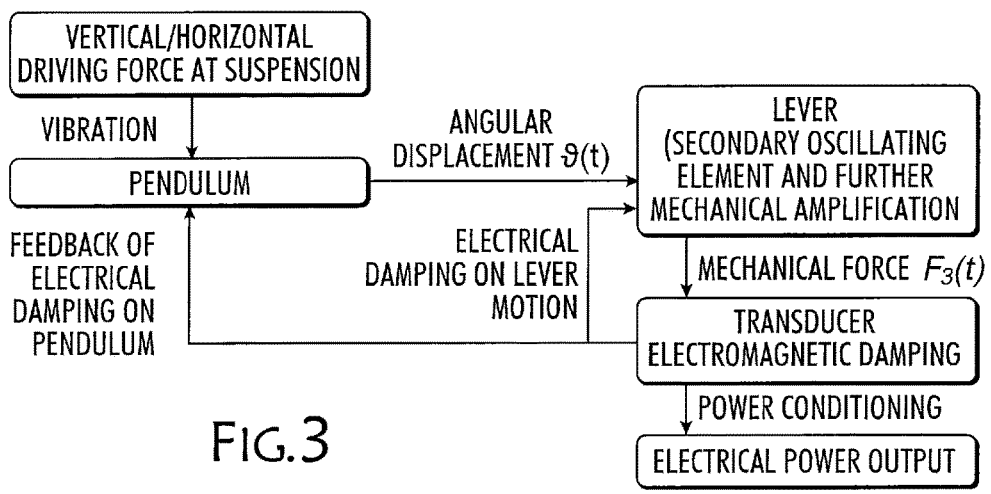
FIG. 3 is a block diagram illustrating the overall structure of a MATLAB numerical model constructed, as described below.

A numerical model using MATLAB Simulink, outlined in FIG. 3, was constructed with numerical parameters in Table 2 to investigate the behaviour of the PEVEH design (in FIG. 2) under various excitation conditions.

TABLE 2

System parameters employed in the numerical simulation

| | | | |
|---|---|---|---|
| m (kg) | 0.51 | $R_{coil}$ (kΩ) | 5.00 |
| $m_1$ (kg) | 0.61 | $R_{load}$ (kΩ) | 5.00 |
| $m_2$ (kg) | 0.31 | c (Nsm$^{-1}$) | 0.2 |
| l (m) | 0.06 | $D_p$ (Nsm$^{-1}$) | 3 |
| $l_a$ m | 0.100 | Feedback $D_p$ to c | 1 |
| $l_b$ m | 0.200 | Power efficiency | 0.5 |
| $f_n$ (Hz) | 2.04 | | | m is the mass of the pendulum bob and $m_1$ and $m_2$ are the masses of each end of the lever beam. l is the length of the pendulum and $l_1$ and $l_2$ are the lengths of each end of the lever beam.

A qualitative comparison of angular displacement build up of the pendulum in time domain as a result of ordinary and parametric resonances near critical damping is presented in FIGS. 4 and 5 respectively. Parametric resonance, intrinsically, has a longer transient state. However, it can potentially accumulate to larger displacement amplitudes (note that the vertical axis of FIG. 5 is compressed, compared to that of FIG. 4). As already established above, the output power response is directly proportional to displacement squared. Therefore, the effect of increasing oscillatory amplitude is amplified in the rise of power peak by this squared relationship. FIGS. 6a and 6b qualitatively compare the power responses of the system for both cases in the frequency domain (note that the vertical axis of FIG. 6b is compressed, compared to that of FIG. 6a). Onset of nonlinearity, and therefore the widening of frequency band, around natural frequency is relatively gradual for ordinary resonance with increasing excitation amplitude A. On the other hand, parametric resonance demonstrates relatively more significant nonlinearity even at low A followed with the onset of higher orders of nonlinearity (steeper peaks) at higher A. However, the latter has zero steady-state response immediately outside the frequency band and/or when A is below an initiation threshold amplitude, which is around 4.25 mm in this setting.

It can be observed that nonlinearity in parametric resonance plays a more significant role and is even seen at low amplitudes. On the other hand, the nonlinearity associated with ordinary resonance only becomes significant at high amplitudes. Therefore, for a given excitation amplitude, the parametric case exhibits a relatively wider operational frequency band. However, the higher nonlinear peaks on the left-hand-side of the natural frequency mark line in FIG. 6b are only achievable either when an initial displacement is present or during a downward frequency sweep. This is because during an upward frequency sweep, initial system displacement is absent upon reaching these otherwise operational frequency band; in other words, the system may be trapped at a lower bifurcation point.

A steep jump (the elongated peak shape) in the nonlinear peak is observed at high excitation amplitudes in FIG. 6b, suggesting the onset of higher orders of nonlinearity. A theoretical explanation for this behaviour is that at these large amplitudes, pendulum oscillations no longer approximate to simple harmonic motion but undergo Hopf bifurcation to a limit cycle motion, hence yielding an even faster growth in peak power levels.

With increase in excitation amplitude, the oscillatory amplitude (and hence the peak power) also increases accordingly. For ordinary resonance, a second-order polynomial relationship is present between displacement amplitude and power growth due to the $\theta \propto P$ relationship. However, the displacement amplitude growth is exaggerated with a higher order nonlinear factor for parametric resonance as demonstrated in the quantitative comparison in FIG. 7. FIG. 7 is a plot of peak steady-state power output against excitation amplitude, illustrating a quantitative numerical comparison between parametric and ordinary resonances' peak power response to varying excitation amplitudes. Beyond a certain threshold of the excitation amplitude, parametric resonance rapidly outperforms ordinary resonance. Qualitatively, ordinary resonance matches a second order polynomial curve whereas parametric resonance exhibits higher order nonlinear characteristics. Therefore, the latter's displacement amplitude (and peak power) grows faster in response to increasing excitation amplitude.

Furthermore, an additional steep jump in amplitude growth rate for parametric resonance at high excitation amplitudes can be observed. This suggests the onset of further higher orders of nonlinearity and is in agreement with the observation in the FIG. 6b.

Evidently, the numerical simulations have demonstrated that parametric resonance has a broader operational frequency band as a result of more significant nonlinearities and higher achievable power peaks than its ordinary resonance counterpart. However, it should be noted that 'an order higher' in performance as described above does not necessarily denote absolute power magnitudes but more essentially the higher-order polynomial behaviour demonstrated in FIG. 7. In fact, when the excitation amplitude just marginally exceeds the required initiation threshold amplitude, the absolute peak power achievable may be lower than its ordinary counterpart. Therefore, the parametric approach is increasingly rewarding at higher excitation amplitudes.

To verify the theoretical and numerical predictions, a macro-scale electromagnetic prototype as illustrated in FIG. 2 and with system parameters as listed in Table 3 below was constructed and studied. The unmeasured parameters in Table 3 were numerically estimated and fitted in order to match the numerical model with the experimental power response.

TABLE 3

System parameters of the experimental prototype and fitted values of the corresponding numerical model (to match the recorded power response).

| Measured | | Numerically fitted | |
| --- | --- | --- | --- |
| m (kg) | 0.71 | c (Nsm$^{-1}$) | 0.2 |
| m$_1$ (kg) | 1.0 | D$_p$ (Nsm$^{-1}$) | 5.4 |
| m$_2$ (kg) | 0.41 | D$_e$ (Nsm$^{-1}$) | 100 |
| l (m) | 0.07 | D$_e$ coefficient | 0.06($|\theta|$ + 1)$^2$ |
| l$_a$ m | 0.102 | Feedback D$_p$ to c | 0.15 |
| l$_b$ m | 0.255 | Peak power efficiency (parametric) | 0.45 |
| f$_n$ (Hz) | 1.88 | | |
| R$_{coil}$ (kΩ) | 5.20 | Peak power efficiency (parametric) | 0.15 |
| R$_{load}$ (kΩ) | 5.40 | | |

The transducer has a total component volume of around 50 cm$^3$ and practical device volume of nearly 90 cm$^3$. A four-magnet arrangement was employed for the transducer electrical power generation. The magnets are disc-shaped sintered Neodymium Iron Boron with dimensions of 22 mm diameter and 10 mm depth. The coil is also cylindrical in shape with dimensions of 50 mm outer diameter, 5 mm inner diameter, 10 mm depth, 90 microns wire diameter and an estimated coil turns of approximately a quarter of a million. The prototype's total component volume is approximately 500 cm$^3$ and its practical device volume is around 1,800 cm$^3$.

The peak electric power recorded (with an ideal load resistance) at parametric resonance is 956.6 mW at 1.70 ms$^{-2}$ and at ordinary resonance is 27.75 mW at 0.65 ms$^{-2}$. Furthermore, parametric resonance at this setting (from which the peak power figure was noted) did not reach a steady state but was rather constrained by the physical limits of the design, which only permitted the pendulum to exhibit a maximum angular displacement of $$\pm \frac{\pi}{2}$$

radians. If larger angular displacements or circular motion are accommodated, then even higher power levels may be achieved.

FIG. 8 illustrates experimental measurements of experimental oscillatory amplitude build up, for the energy harvester as illustrated in FIG. 2 and having dimensions as in Table 3. Amplitude of θ is directly and linearly proportional to voltage output V; and related to power output P by the relationship: $\theta^2 \propto V^2 \propto P$. Note that the maximum peak-to-peak voltage (V$_p$) recorded in FIG. 8 for parametric resonance is much greater than for ordinary resonance (56.4 V as opposed to 21.8 V).

The qualitative comparison of oscillatory amplitude build up shown in FIG. 8 is in agreement with the numerical model from FIGS. 4 and 5 in regards to a longer transient state for the parametric case. However, the eventual steady state accumulated to a much higher power level than ordinary resonance.

FIG. 9 shows Bode plots of the experimental power response in the frequency domain for various excitation amplitudes A, for the energy harvester tested in FIG. 8. The fitted simulation equivalent of the recorded peak power data is also plotted. With higher A, parametric resonance's nonlinearity rapidly becomes significant and results in the widening of frequency bandwidth, while that of ordinary resonance remains relatively confined. The steep jump of the nonlinear peak associated with parametric resonance at high amplitudes as described in FIG. 6b is validated. The nonlinear peaks have different responses during upward and downward frequency sweeps because they are only achievable when significant initial displacements are present to allow the system to jump to the higher bifurcation point.

Near similar excitation levels (see Table 4), in these experiments parametric resonance yielded over 6 times higher peak power than ordinary resonance. The mechanical shaker employed to drive the energy harvester had a physical limit of approximately 5 mm in amplitude. Within this constraint, ordinary resonance failed to demonstrate observable nonlinearities. The operational frequency bandwidth is measured from half power points $$\left( \text{peak} \times \frac{1}{\sqrt{2}} \right).$$

TABLE 4

Comparison of ordinary and parametric resonances' experimental performance. The latter has demonstrated over 6 times higher absolute peak power (at comparable acceleration ~0.6 ms$^{-2}$) and also performed an order better in terms of power density normalised against acceleration squared. Higher accelerations for ordinary resonance were not measured because of the shaker's physical amplitude limit of nearly 5 mm.

| | Peak Power (mW) | Frequency (Hz) | Amplitude (mm) | Acceleration (ms$^{-2}$) | Normalised Power Density μWcm$^{-3}$m$^{-2}$s$^4$ |
| --- | --- | --- | --- | --- | --- |
| Ordinary | 2.17 | 1.88 | 1.93 | 0.27 | 1.65E+01 |
| | 4.70 | 1.88 | 3.00 | 0.42 | 1.48E+01 |
| | 27.75 | 1.88 | 4.65 | 0.65 | 3.65E+01 |

TABLE 4-continued

Comparison of ordinary and parametric resonances' experimental performance. The latter has demonstrated over 6 times higher absolute peak power (at comparable acceleration ~0.6 ms$^{-2}$) and also performed an order better in terms of power density normalised against acceleration squared. Higher accelerations for ordinary resonance were not measured because of the shaker's physical amplitude limit of nearly 5 mm.

|  | Peak Power (mW) | Frequency (Hz) | Amplitude (mm) | Acceleration (ms$^{-2}$) | Normalised Power Density μWcm$^{-3}$m$^{-2}$s$^4$ |
|---|---|---|---|---|---|
| Parametric | 171.5 | 3.78 | 1.00 | 0.57 | 2.93E+02 |
|  | 415.9 | 3.704 | 2.03 | 1.1 | 1.91E+02 |
|  | 956.7 | 3.572 | 3.37 | 1.7 | 1.84E+02 |

FIG. 10 illustrates experimental frequency bandwidth and extractable power of parametric resonance (frequency scale halved for the purpose of comparison) and ordinary resonance at comparable accelerations (~0.6 ms$^2$), for the energy harvester tested in FIGS. 8 and 9. The darker shaded regions denote extractable power within the half power bands. In absolute terms, ordinary and parametric resonances have half power bands of 0.033 and 0.055 Hz respectively. The lighter shaded region represents the additional potential power extractable by parametric resonance above ordinary resonance's half power point $$\left(\text{peak} \times \frac{1}{\sqrt{2}}\right)$$

(bandwidth ~0.153 Hz, over 4-fold wider). FIG. 10 contrasts the frequency bandwidth and extractable power for both resonances at similar input acceleration levels (~0.6 ms$^{-2}$). In this scenario, the parametrically driven system exhibited around 67% increase in operational frequency band compared with ordinary resonance. Taking the ordinary resonance half power points as reference, the parametric case power curve experienced over 4-fold broader frequency bandwidth.

The energy harvester illustrated in FIG. 2, and having dimensions as in Table 3, has experimentally performed an order of magnitude better at parametric resonance than at ordinary resonance, confirming the theoretical and numerical predictions of its advantages. A summarised comparison of the merits and demerits of the two cases are presented in Table 5. Apart from comparing with itself, Table 6 briefly contrasts the prototype's performance against selected current state-of-the-art macro-sized electromagnetic vibration energy harvesters. The experimental results reported here compare favourably against the current state-of-the-art.

As mentioned above, Daqaq et al., (2009) appears to be the first and only literature to date that has investigated the employment of parametric excitation for vibration energy harvesting. But despite this analysis, a leap forward to achieve practical performance has yet to be reported in the prior art. As described in the prior art, a serous limitation of a parametrically excited system is the need for the excitation amplitude to overcome an initial threshold; below which, steady state response will be zero. Daqaq et al., has provided an analytical model for this threshold amplitude, but does not provide any solution to the problem.

TABLE 5

A summarised comparison between ordinary and parametric resonances.

|  | Ordinary | Parametric |
|---|---|---|
| Peak power density normalised against acceleration | lower | an order higher |
| Increase in nonlinearity and frequency bandwidth with amplitude growth | not observed | immediately observable |
| Transient state | longer | shorter |
| Initiation threshold amplitude requirement | no | yes |
| Non-zero initial displacement requirement | no | yes |

The initiation threshold amplitude issue is not unique to Daqaq et al.'s parametrically excited cantilever. However, the two-degrees-of-freedom PEVEH design reported here is advantageously less constrained by this shortcoming. This is because the inventors have appreciated that the principal damping in the system acts as the key contributor to this limitation (and the threshold is nonexistent for a theoretically undamped scenario). For PEVEH, the principal source of damping (the transducer) acts on the secondary oscillating element (the lever beam). So the excitation of the primary oscillating element (pendulum) is on a different degree-of-freedom and the effect of initial damping is minimised. A disadvantageously higher initiation threshold amplitude is required if the principal source of damping is on the same degree-of-freedom as the parametric resonance, as in Daqaq et al.

The requirement of a non-zero initial displacement (to 'push' the system out of stable equilibrium) is another property of most parametrically excited systems. A design that places the rest position in an unstable equilibrium may serve as a solution.

Parametrically driven harvesters, despite their potential capabilities of exhibiting significantly higher performance, are not perfect. Therefore, the integration of both direct and parametric excitations to compensate and complement each other, can serve as an ideal solution for vibration energy harvesting.

The phenomenon of autoparametric resonance may also advantageously be used. The presence of a directly-excited component within such working mechanisms reduces the initiation threshold amplitude and helps to overcome the requirement of a non-zero initial displacement. Therefore, it can complement a parametrically-excited harvester's shortcomings while exploiting its performance advantages.

The inventors' experiments have demonstrated the use of parametric resonance for vibration energy harvesting. The numerical simulations and experimental prototype constructed have verified the theoretical prediction of an order higher in oscillatory amplitude (hence power) growth than ordinary resonance. Experimentally recorded peak power at parametric resonance (171.5 mW at 0.57 ms$^{-2}$) has outperformed ordinary resonance (27.75 mW at 0.65 ms$^{-2}$) by an order of magnitude in terms of power density normalised to the squared input acceleration. The growth of significant nonlinearities with increasing amplitude also demonstrated 67% increase in operational frequency bandwidth measured from their respective half power points (or over 4-fold if ordinary resonance's half power point is taken as the reference). Additionally, these initial experimental results compare favourably with respect to the current state-of-the-art.

TABLE 6

Comparing PEVEH with selected current state-of-the-art macro-sized electromagnetic vibration energy harvesters in terms of power density normalised against acceleration squared.

| Reference | Peak Power (mW) | Freq. (Hz) | Volume (cm$^3$) | Acceleration (ms$^{-2}$) | Normalised Power Density $\mu$Wcm$^{-3}$m$^{-2}$s$^4$ |
|---|---|---|---|---|---|
| PEVEH (parametric) | 171.5 | 3.57 | 1,800 | 0.57 | 2.93E+02 |
| Perpetuum (2008) | 1.000 | 100 | 135 | 0.25 | 1.19E+02 |
| Lumedyne (2008) | 1.000 | 53 | 27 | 1 | 3.70E+01 |
| PEVEH (ordinary) | 27.75 | 1.88 | 1,800 | 0.65 | 3.65E+01 |
| Ferro Sol. (2009) | 5.270 | 60 | 170 | 0.98 | 3.23E+01 |
| Hadas (2007) | 3.500 | 34.5 | 45 | 3.1 | 8.09E+00 |
| Waters (2008) | 18.00 | 90 | 27 | 9.81 | 6.93E+00 |
| Glynne-Jones (2001) | 2.800 | 106 | 3.66 | 13 | 4.53E+00 |

FIGS. 12 and 13 summarise preferred design principles which may be employed in developing embodiments of the invention. In particular, these figures summarise options for the natures of the first and second mechanical amplifiers which may achieve either reduction in the vibration amplitude threshold of the parametric resonator, or amplification of the input vibration amplitude to drive the parametric resonator, advantageously (optionally) by forming an auto-parametric resonator.

These design principles relate to option (1) and option (2) described above, and to the structure defined in the Statement of Invention which refers to first and second mechanical amplifiers, or mechanisms, coupled together. In option (1), a first mechanical amplifier comprising a parametric resonator is coupled to a further (second) mechanical amplifier which is damped to extract power. This corresponds to the upper line of the diagram in FIG. 12. In option (2) a (second) mechanical amplifier comprising a parametric resonator is coupled to, and is driven through, a first mechanical amplifier, and the second mechanical amplifier is damped to extract power. This corresponds to the lower line of the diagram in FIG. 12.

FIG. 13 then sets out various embodiments of these design principles. For example in option (1) the first mechanical amplifier, comprising a parametric resonator, may be coupled to a second mechanical amplifier comprising a component such as a direct resonator or a lever. In option (2), for example, the first mechanical amplifier may comprise a component such as a direct resonator or a lever, and may be coupled to a second mechanical amplifier comprising a parametric resonator, but which may additionally comprise a second parametric resonator or a direct resonator.

FIGS. 12 and 13 refer to "n degrees-of-freedom" between the first and second mechanical amplifiers and between the second mechanical amplifier and the mechanical-to-electrical transduction step, or damper, for generating an electrical power output. In each case, the value of n may be zero or any integer. Thus, for example, the first mechanical amplifier may be coupled directly (through no other degrees-of-freedom) to the second mechanical amplifier, and/or the mechanical-to-electrical transduction step may act directly on the second mechanical amplifier. Also, in each instance in FIGS. 12 and 13, the value of n may be different.

FIGS. 14 to 21 illustrate specific designs outlined in FIGS. 12 and 13.

Figure 14:
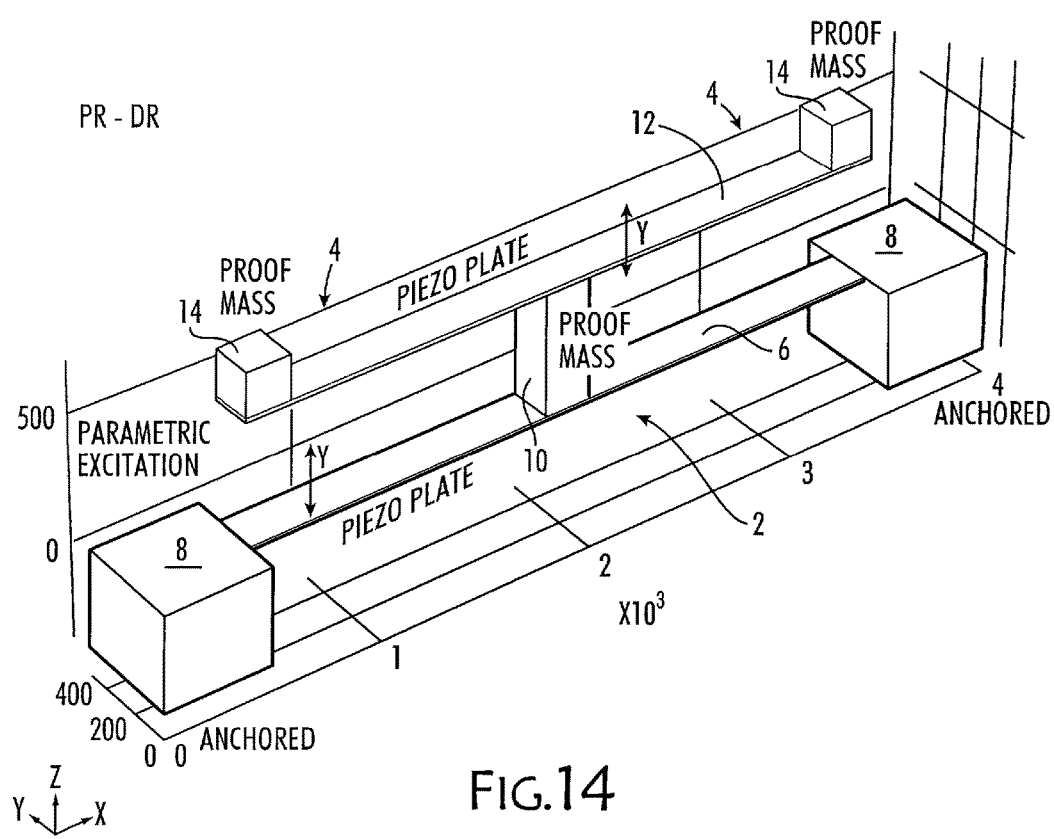

FIG. 14 illustrates a micro-scale or MEMS energy harvester incorporating a first mechanical amplifier comprising a parametric resonator 2 coupled to a second mechanical amplifier comprising a direct resonator 4. The parametric resonator comprises an elastic beam 6 extending between two anchor points 8. The beam carries a proof mass 10 at its mid point. This resonator is parametrically driven by vibration parallel to the axis of the beam 6, as shown in FIG. 14.

The proof mass 10 of the parametric resonator is coupled to the mid point of an elastic cantilever beam 12 of the direct resonator. A proof mass 14 is carried at each of the two free ends of the beam 12. The beam 12 is of a piezoelectric material, so that electrical power can be extracted when the beam resonates.

Advantageously, the resonant frequencies of the parametric and direct resonators are matched, to be equal or to be multiples of each other. This similarly applies, as appropriate, to other embodiments of the invention described below. In particular, where a parametric resonator (second mechanical amplifier) is driven by means of a direct resonator (first mechanical actuator) the resonant frequency of the direct resonator may advantageously be twice the resonant frequency of the parametric resonator so that auto-parametric resonance may be obtainable.

In FIG. 14, both the parametric resonator and the direct resonator are shown as being fabricated from a piezoelectric material (piezo plate). This choice of material may be convenient for fabrication of the energy harvester but does not imply that electrical power should be extracted from the parametric resonator when it resonates. In this embodiment, the parametric resonator embodies a first mechanical amplifier and the direct resonator embodies a second mechanical amplifier, and it is preferred that electrical power should be extracted from the second mechanical amplifier and not from the first. However, if desired, some electrical power may be extracted from the first mechanical amplifier. This may disadvantageously increase the activation amplitude of the parametric resonator, but the coupling of the parametric resonator to the direct resonator (the second mechanical amplifier) and the extraction of at least a portion of the electrical power output of the energy harvester from the direct resonator advantageously reduce the damping of the parametric resonator and thus reduce its activation amplitude, by comparison with an energy harvester (as in the prior art) using only a parametric resonator from which all of the electrical power output is extracted.

These same points apply as appropriate to each embodiment described below in which more than one component of an energy harvester is described as being fabricated from a piezoelectric material.

Figure 15:
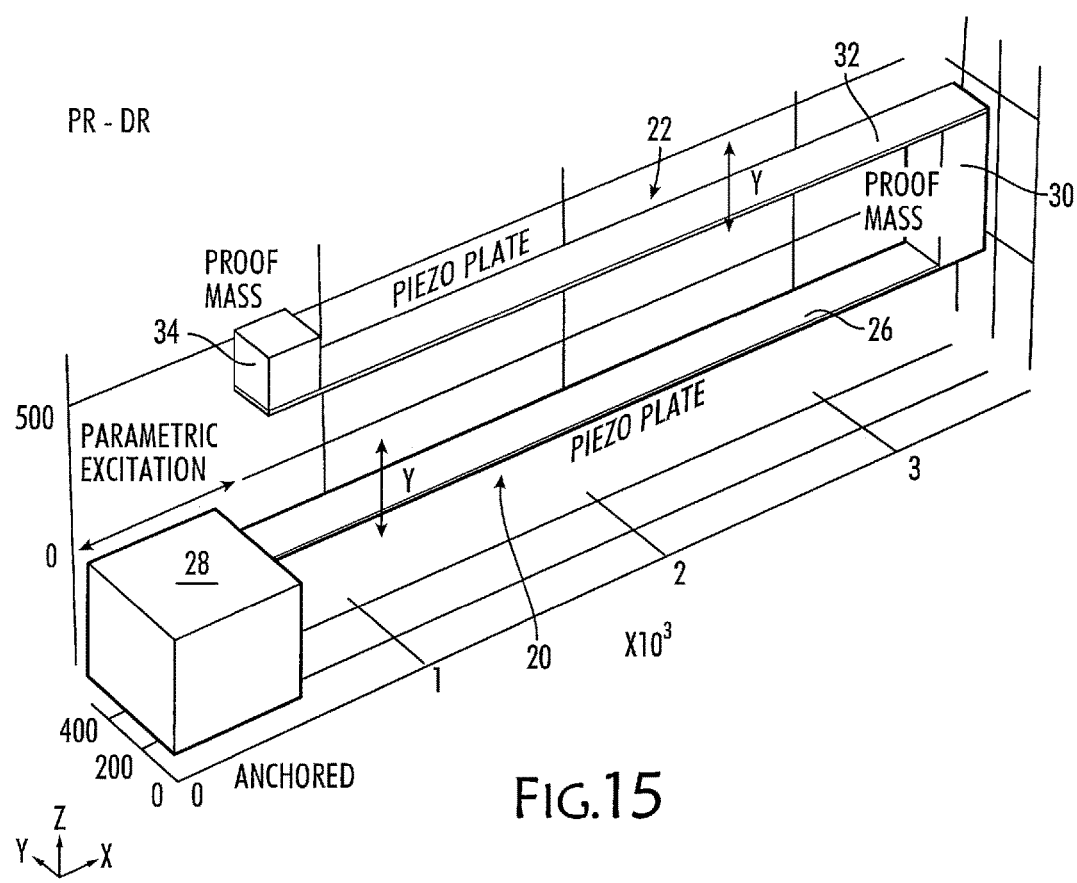

FIG. 15 illustrates a micro-scale or MEMS energy harvester incorporating a first mechanical amplifier comprising a parametric resonator 20 coupled to a second mechanical amplifier comprising a direct resonator 22. The energy harvester of FIG. 15 operates in a similar way to the harvester of FIG. 14. The parametric resonator comprises a cantilever beam 26 extending from an anchor 28. The beam carries a proof mass 30 at its free end and is driven in parametric resonance by vibration parallel to the beam axis. The direct resonator comprises a cantilever beam 32 extending from the proof mass of the parametric resonator, and carrying a direct-resonator proof mass 34 at its other end.

In the energy harvesters of FIGS. 14 and 15, the electrical energy output is preferably taken from the direct resonator, minimising damping of the parametric resonator and therefore minimising the initiation amplitude threshold of the parametric resonator.

In FIGS. 14 and 15, electrical power is extracted piezoelectrically. Other means, such as electrostatic combs, could be used, as the skilled person would appreciate.

Figure 16:
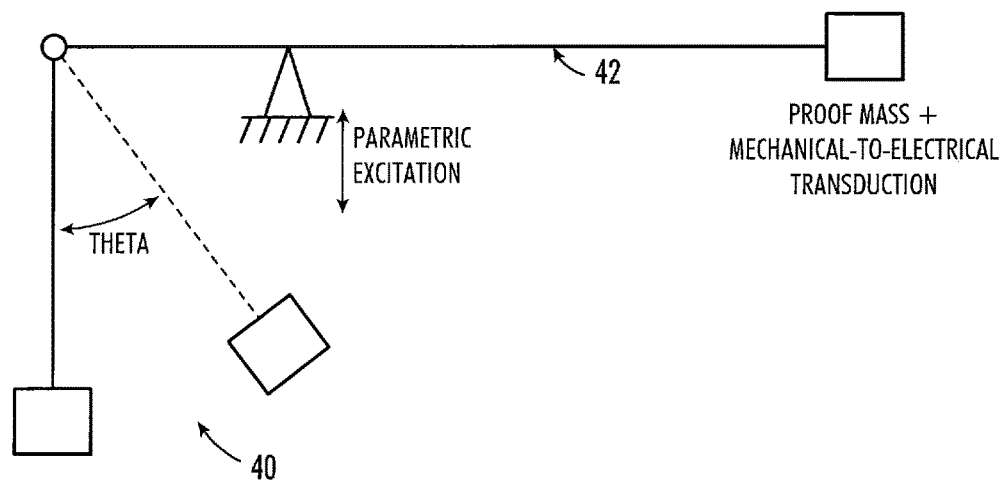

FIG. 16 illustrates the structure of an energy harvester in which a first mechanical amplifier comprises a parametric resonator 40 and is coupled to a second mechanical amplifier which comprises a lever 42. This is the same structure as illustrated in FIG. 2.

Figure 17:
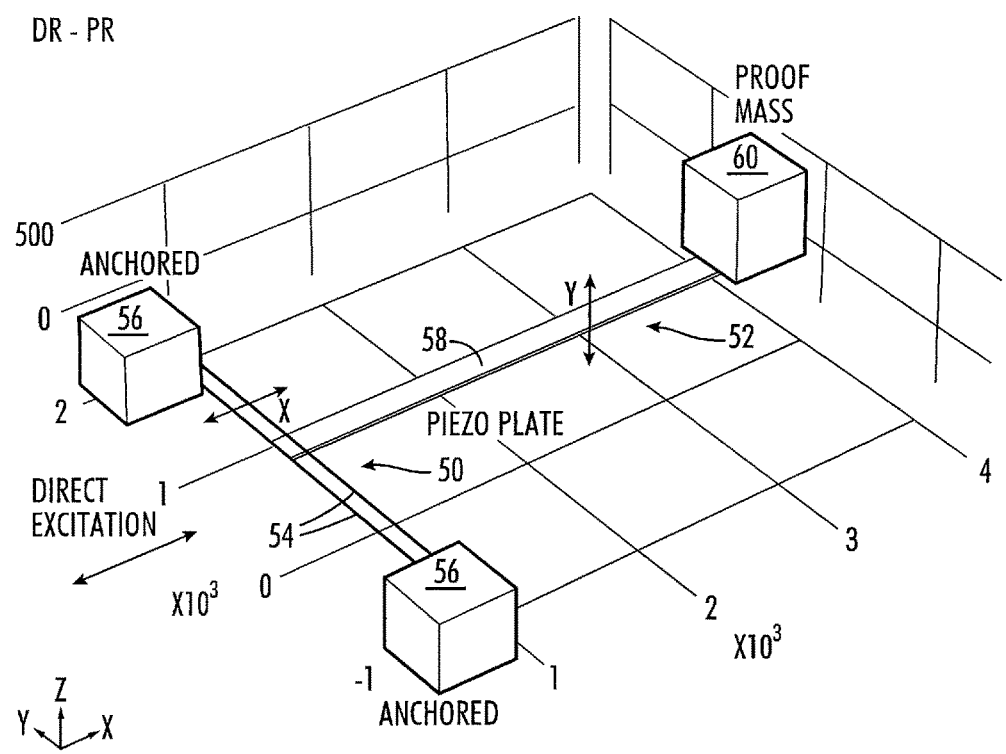

FIG. 17 illustrates a micro-scale or MEMS energy harvester in which a first mechanical amplifier comprises a direct resonator 50 and is coupled to a second mechanical amplifier which comprises a parametric resonator 52. This structure may form an auto-parametric resonator if the resonant frequencies of the direct and parametric resonators are appropriately matched. The direct resonator comprises a pair of elastic beams 54 extending between two anchors 56. The parametric resonator comprises a cantilever beam 58 extending from a mid-point of the beams of the direct resonator, carrying a proof mass 60 at its free end. The direct resonator is driven by vibrations perpendicular to the axis of its beams 54 and parallel to the axis of the beam 58 of the parametric resonator. This causes vibration of the parametric resonator in the direction y shown in FIG. 17. Electrical power can be extracted from the parametric resonator.

Figure 18:
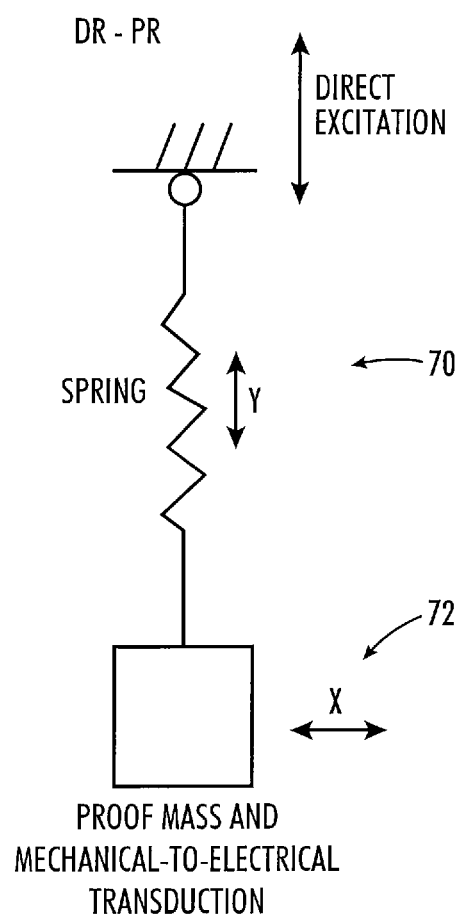

FIG. 18 is a schematic diagram of an energy harvester incorporating a first mechanical amplifier comprising a direct resonator 70, coupled to a second mechanical amplifier which comprises a parametric resonator 72. As in FIG. 17, this structure may form an auto-parametric resonator.

Figure 19:
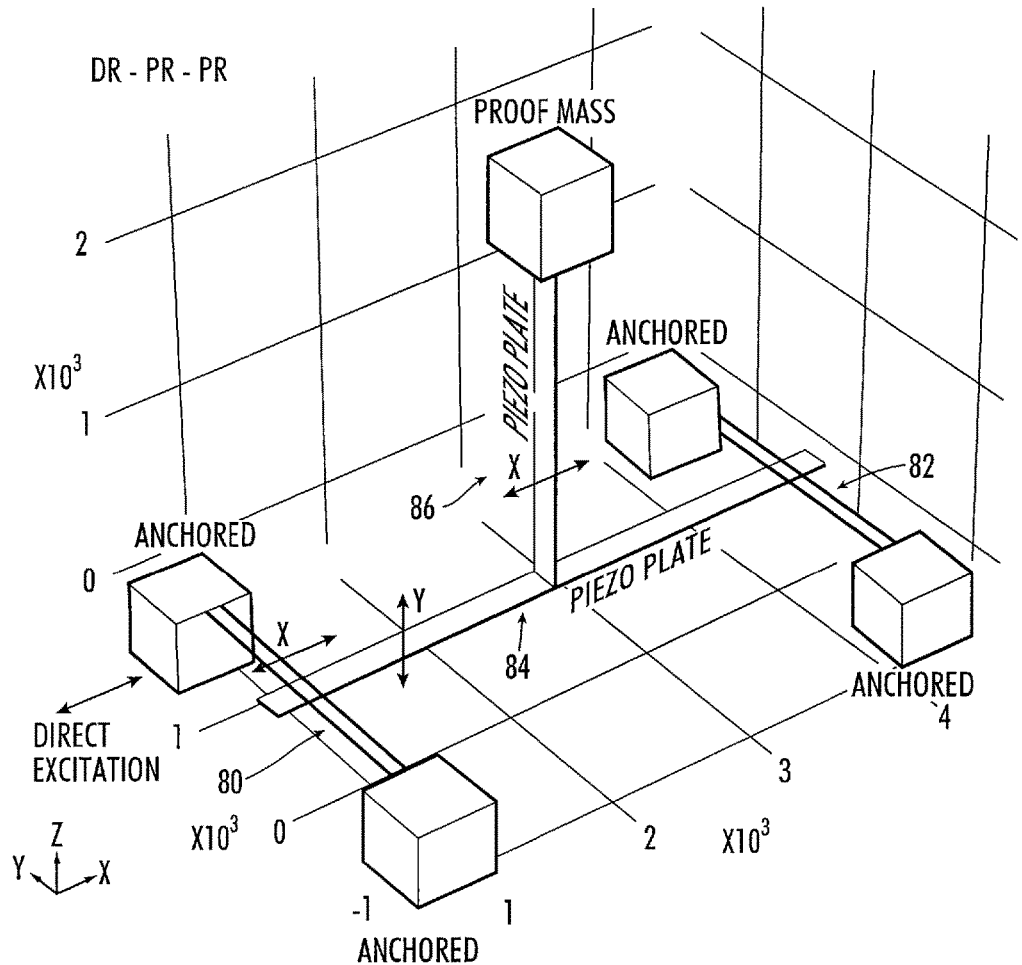

FIG. 19 illustrates a micro-scale or MEMS energy harvester in which a first mechanical amplifier comprises a direct resonator 80, 82 and is coupled to a second mechanical amplifier which comprises a parametric resonator 84. The second mechanical amplifier is coupled through a further degree of freedom to a second parametric resonator 86, which may be electrically damped.

Figure 20:
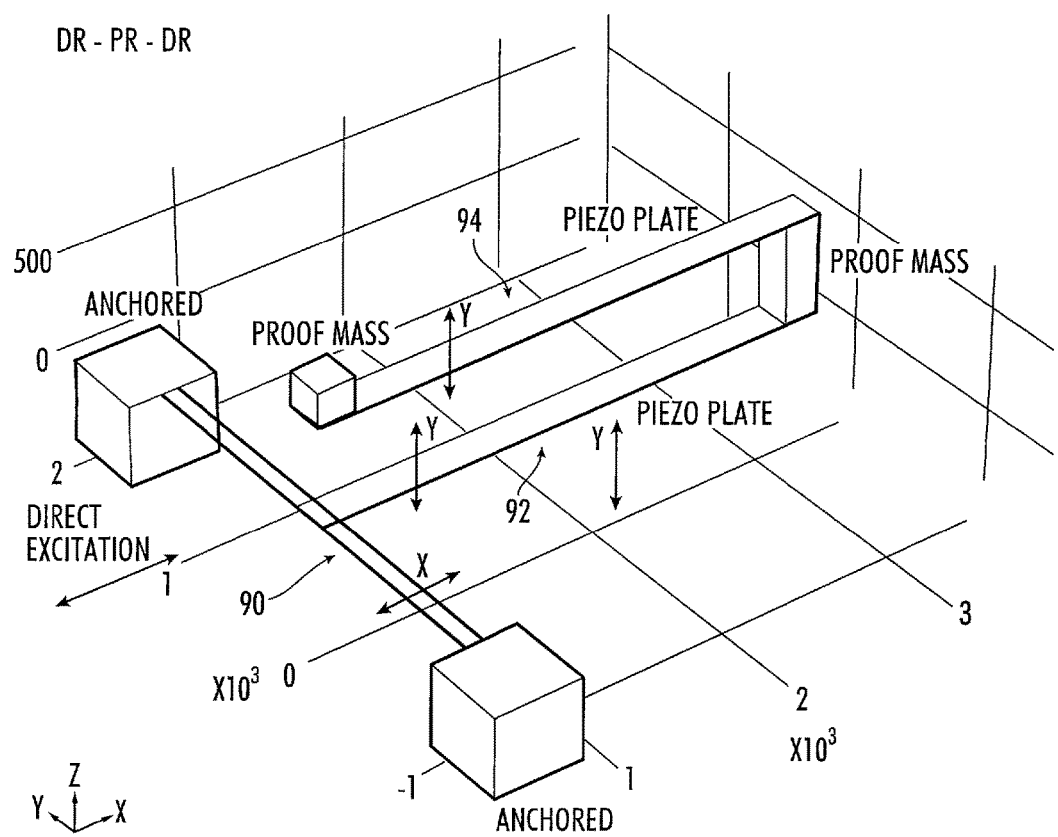

FIG. 20 illustrates a micro-scale or MEMS energy harvester in which a first mechanical amplifier comprises a direct resonator 90 and is coupled to a second mechanical amplifier which comprises a parametric resonator 92. The second mechanical amplifier is coupled to a second direct resonator 94, which may be electrically damped.

Figure 21:
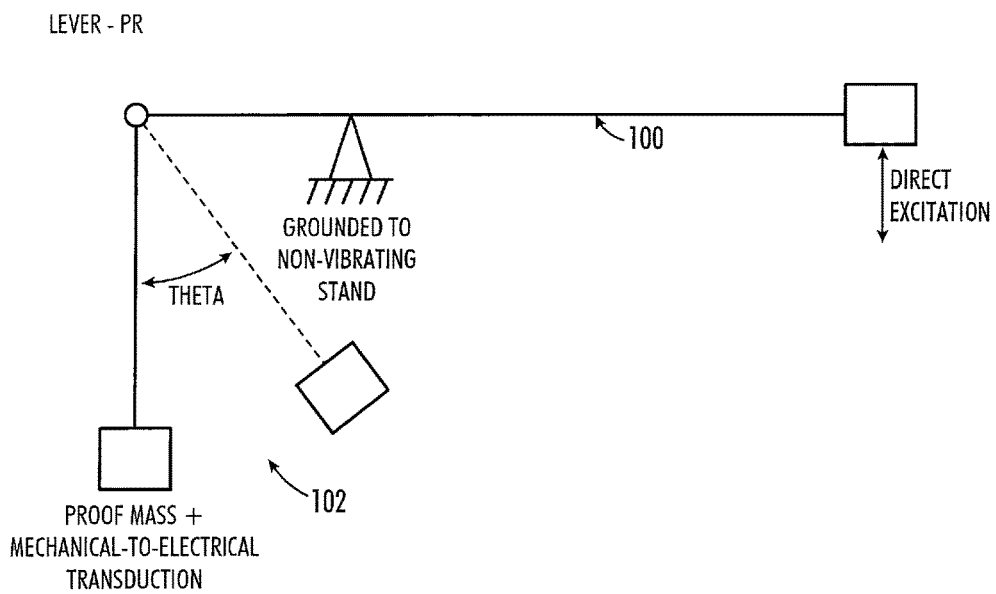

FIG. 21 is a schematic diagram of an energy harvester in which a first mechanical amplifier comprises a lever 100 and is coupled to a second mechanical amplifier which comprises a parametric resonator 102. The parametric resonator may be electrically damped.

A design model of a micro-cantilever 200 with capacitive combs 202 is shown in FIG. 23. Out-of-plane vibration is equivalent to direct excitation while an in-plane driving force can potentially induce parametric resonance at the right frequency and amplitude conditions. FIG. 24 is an iteration of the second design route from FIG. 12 by adding a double beam 206 between the anchor 208 and the (base) end 210 of the cantilever. This additional initial spring structure acts as the electrically undamped additional (first) mechanical amplifier (direct resonator). The structure in FIG. 24 can potentially observe auto-parametric resonance. This is a subset of parametric resonance that is not initiated by an external (hetero) parametric excitation but rather a direct excitation acting on the system's directly excitable component (the additional initial double beam, or springs, 206), which internally transfers energy to the parametric resonator (the cantilever). Mathematically, both hetero- and auto-parametric resonances reduce to the same thing.

The designs from FIGS. 23 and 24 were fabricated using MEMSCAP foundry's Silicon-On-Insulator (SOI) Mutli-User MEMS Processes (MUMPs) and sample devices can be seen in FIGS. 25 and 26. FIG. 27 shows an enlarged view of the double beam 206 of the device of FIG. 26. FIG. 29 illustrates the operating principles of the device of FIGS. 26 and 27. The silicon thickness is 25 μm and the total device volume is ~0.147 mm$^3$. For each movable comb finger extending from the cantilever beam, a corresponding fixed capacitive comb finger is placed beside it with 10 μm gap space; thus forming an electrostatic transducer.

Experimental tests were carried out using these designs. All tests were undertaken at normal air pressure and cantilevers were mounted with free ends upright to overcome the non-zero initial displacement criterion. This upright arrangement is equivalent to an inverted pendulum and the cantilever tip rests in an unstable equilibrium. COMSOL simulations (FIGS. 23 and 24) and frequency sweeps by a PolyTec laser vibrometer of the MEMS devices revealed no resonant modes at either twice or half of the natural frequencies. Therefore, the possible presence of other resonant peaks within the vicinity of these frequency ranges can be excluded. Through mechanical excitation by a shaker, 1st and 3rd order parametric resonances were recorded for the auto-parametric harvester of FIG. 26. Although onsets of 2nd order parametric resonance was also observed around $f_n$, steady-state response always converged towards the fundamental mode of resonance. As predicted, this design had a lower initiation threshold amplitude than the FIG. 25 device, Parametric harvester: ~3 g.
Auto-parametric harvester (with additional spring)
1st order: ~0.1 g.
3rd order: ~0.3 g.

TABLE 7

Comparing the results with selected counterparts from the literature in terms of power density normalised against acceleration squared.

| Reference | μWcm$^{-3}$m$^{-2}$s$^4$ |
|---|---|
| Parametric (1st order) | 61.7 |
| Parametric (3rd order) | 50.1 |
| Roundy et al. (2002) | 22.9 |
| Wong et al. (2009) | 19.0 |
| Fundamental mode | 4.24 |

In fact, an order of magnitude higher in power response can be observed for parametric resonance well within 1 g of acceleration and is clearly demonstrated in FIG. 28. At 4.2 ms$^{-2}$, power peaks of 0.011 μW, 0.156 μW and 0.127 μW were recorded for the fundamental mode, first order parametric and third order parametric resonances respectively. Table 7 briefly contrasts these results with a few selected electrostatic harvesters in the literature. Additionally, the operational frequency bandwidth (measured from half power points) of the principal parametric resonance is approximately twice than that of the fundamental mode of resonance.

Thus, an out-of-plane (to accommodate large displacements) electrostatic MEMS prototype (~0.147 mm$^3$), driven at 4.2 ms$^{-2}$, has demonstrated a peak power of 0.011 μW at the fundamental mode of resonance and 0.16 μW at the principal parametric resonance. A two-fold increase in frequency bandwidth was also observed for the parametric scenario.

MEMS, thin/thick-film and macro-scale devices are being developed by the inventors to investigate the power efficiency of this novel technique in contrast to directly excited harvesters when induced to real infrastructural vibration.

Further improvements may be obtainable by the simultaneous employment of both direct and parametric resonance, and/or the incorporation of bi-stability, into the base resonator (first mechanical amplifier) which may further improve the mechanical-to-electrical energy conversion efficiency by broadening the output power spectrum. In the inventors' experiments, multiple direct and parametric resonant peaks from a multi-degree-of-freedom system were observed and an accumulative ~10 Hz half-power bandwidth was recorded for the first 40 Hz.

Any resonator can potentially exhibit both direct and parametric resonance, but is only most responsive to one, depending on the excitation criteria. Therefore, a resonator configured to displace parallel to the forced excitation may be considered as a primarily direct resonator (DR) and a resonator configured to displace perpendicular to forced excitation may be considered as a primarily parametric resonator (PR).

Intrinsically, parametrically-excited resonance is associated with higher energy storage than directly-excited resonance, as linear damping does not saturate amplitude growth. Although vibrational nonlinearities that are almost always associated with parametric resonance can potentially result in a moderate broadening of the frequency response as compared to the linear directly excited counterparts, it is still desirable to increase the operational frequency band of a parametric resonator.

A further aspect of the invention may therefore provide an intrinsically multi-frequency complementary harvester that has ready access to multiple direct resonant peaks; and when the boundary conditions become favourable, the more effective parametric resonance can be called upon.

A problematic boundary condition of parametric resonance is the presence of the damping-dependent initiation threshold amplitude described above, which the excitation needs to attain prior to accessing the more "profitable" regions of this resonant phenomenon. The addition of an orthogonal initial clamped-clamped beam (CCB) spring, such as shown in FIG. 30(a), helps to passively reduce this activation barrier by amplifying the base excitation. This is similar to the structures illustrated in FIGS. 17, 19, 20, 24, 26, 27 and 29.

In practice the CCB may be anchored at its ends or supported in any convenient manner, rather than being clamped.

Bi-stability can be introduced into this system by reducing the distance between the clamps, thus pre-stressing (bending) the CCB. A symmetric bi-stable system has an unstable equilibrium at zero displacement and two stable equilibria positioned on either sides of the origin as shown in FIG. 30(b) and defined by the generic equations below.

$$m\ddot{x}+c\dot{x}+\dot{U}(x)=F(t) \quad (12)$$

$$U(x)=-0.5kx^2+0.25\mu x^4 \quad (13)$$

where, U, x, m, c, F, k and μ are potential energy, displacement, mass, damping, driving force, linear negative spring constant and the Duffing parameter respectively. Equation 14 defines the position of potential intra-wells $\pm x_s$ and Equation 15 represents the potential barrier ΔU (energy required to hop across to the other stable state).

$$\pm x_s=\pm\sqrt{k/\mu} \quad (14)$$

$$\Delta U=k^2/4\mu \quad (15)$$

Whenever the system hops from one intra-well to another, i.e. the snap-through state for the CCB, a relatively large amount of energy is released that may be electrically harvested.

An experimental setup (component volume: ~8.14 cm³) as illustrated in FIG. 31 was used to characterise the effects of bi-stability arising from pre-stress. The CCB 220 acts as the initial spring for the subsidiary PR (parametric resonator) 222 in the form of a cantilever extending from the CCB. A piezoelectric ceramic (PZT) 224, by APC International, was employed as the mechanical-to-electrical transducer and was attached to the cantilever using epoxy adhesive. The CCB is held between clamps 228.

By adjusting the size and position of a seismic mass 226, mounted at the end of the cantilever of the PR, the natural frequency of the CCB can be tuned to either match or mismatch the principal parametric resonance of the PR. When frequency matching does take place, auto-parametric resonance can be activated. This is a subset of parametric resonance induced by an internal transfer of energy arising from a certain integer ratio relationship in the natural frequencies of the constituting resonating elements. The fundamental mode of the CCB and the principal parametric mode of the PR do not co-exist and the system alternates between the two modes of resonance. The characteristic identifier of principal parametric resonance is that the excitation frequency is twice that of the observed response.

Varying levels of pre-stress were applied to the CCB 220 to form a bi-stable beam as shown in FIG. 30, and a constant trend was observed as shown in FIG. 32. With increasing bi-stability, a significant and progressive rise in direct and parametric resonant peaks of the PR was experimentally observed. On the other hand, the CCB showed a decrease in quality factor and witnessed the onset of twin resonant peaks around the original natural frequency. This observation agrees with a COMSOL simulation, where the CCB appears to possess a slightly different resonant frequency associated with the different potential intra-wells (snaphthrough state). Table 8 presents peak power results obtained for an excitation input acceleration of ~5 ms⁻², load resistance of 0.38 MΩ and clamp gaps of 80 mm (mono-stable), 70 mm (mildly bi-stable) and 60 mm (highly bi-stable).

TABLE 8

Power peaks of various fundamental modes of PR and CCB as well as principal parametric mode of PR at varying levels of bi-stability driven at a constant ~5 ms⁻².

| Power peaks (μW) | Mono-stable | Mildly bi-stable | Highly bi-stable |
| --- | --- | --- | --- |
| PR (direct) | 0.70 | 3.20 | 11.8 |
| CCB (direct) | 1.11 | 0.61 | 0.21, 0.41 |
| PR (parametric) | 18.0 | 53.9 | 92.8 |

Although, once activated, the PR (operated at parametric resonance) performed substantially better with higher bi-stability, the limiting barrier of the initiation threshold required to activate it also increased as follows, Mono-stable: 3.60 ms⁻²
Mildly bi-stable: 4.05 ms⁻²
Highly bi-stable: 4.58 ms⁻²

This behaviour is a result of lower vibrational response from the stiffer pre-stressed CCB, which is used to amplify the base excitation for PR. Therefore, the effectiveness of the CCB as a passive aid towards lowering the initiation threshold for parametric resonance is reduced as pre-stress increases, though the effectiveness of the CCB in transferring energy to the PR is increased.

Although parametric resonance can offer significantly higher energy conversion efficiency than its directly excited counterparts, its initial activation may need to fulfil a list of criteria as follows.

$\omega = \omega_n/2$; where $\omega$, $\omega_n$ and n are the excitation frequency, natural frequency and an integer denoting the order of parametric resonance respectively.

Excitation amplitude must overcome the damping dependent initiation threshold amplitude.

There must be a non-zero initial displacement.

A transient build up time must be endured prior to attaining the parametric resonant peak.

Therefore, employing the more accessible direct resonance alongside parametric resonance helps maximise the response from random vibration input. In the case of bi-stability, the largest energy is released during the snapthrough states. However, crossing the potential barrier between these states requires a large energy input. Additional side springs replacing the anchored clamps of the pre-stressed CCB described above may help to modulate or reduce the height of the potential barrier and increase the probability of snaphthrough. The overview concept of this directly and parametrically excited bi-stable resonator can be represented in the model diagram shown in FIG. 33, in which the same reference numerals as in FIG. 34 (described below) are used.

The parameters $m_1$, $m_2$ and A denote effective mass of a direct resonator (DR), effective mass of a parametric resonator (PR) and the amplitude of the external acceleration. From the model diagram in FIG. 33, the resonator with displacement parallel to excitation is considered as the primarily directly excited resonator (DR) and vice versa for PR. A design iteration of this, showing a COMSOL model, is presented in FIG. 34. In this structure a bi-stable beam 230 is supported at its ends by two side springs 232. The ends of the side springs are anchored 234 and the side springs urge the ends of the bi-stable beam towards each other, providing a pre-stress to retain the beam 230 in a bi-stable state. Parametric and direct resonators 236, 238 in the form of cantilevers extend from the bi-stable beam. Each cantilever comprises a piezoelectric transducer 240, 242 for the extraction of electrical power. The structure is arranged to be excited by vibrations in a direction parallel to the parametric resonator and perpendicular to the direct resonator.

FIG. 35 illustrates the potential barrier modulation in the bi-stable system of FIG. 34. As the side springs vibrate, the pre-stress applied to the CCB also varies with a time period T. T/4 and 3T/4 are when the potential barrier is smallest from one of the wells as the vibrating side springs alleviate the pre-stress. 0T and T/2 is when the side springs return to their respective origins and the potential barrier is unchanged. This increases the probability of crossing over to the neighbouring intra-well of the bi-stable beam. Energy transfer may be maximised if resonant modes of the side springs are also activated.

The prototype in FIG. 34 was subjected to measured vibration data (amplified 12 times) from a railway track and the voltage response from the DR and PR transducers can be seen in FIG. 37. (In this prototype, no seismic end masses were attached to the ends of the resonating cantilevers. In an improved device, end masses may be attached in order to increase the sensitivity of the energy harvester.) Input vibration had random frequency peaks covering a span of nearly 60 Hz with rapid frequency variations. A FFT analysis of the voltage output confirms a broadband response. As seen from this initial experiment, this multi-frequency harvester is more responsive than a solely direct resonator for broadband real vibration and incorporates the possibility of activating the high conversion efficiency associated with parametric resonance when boundary conditions become favourable.

In summary therefore, the inventors' experiments show a significant increase in both the fundamental mode peak and principal parametric peak with increased bi-stability through a pre-stressed CCB. A directly and parametrically excited bi-stable prototype has also demonstrated broadband operation by covering approximately a third of accumulated bandwidth between 10 Hz to 40 Hz. This multi-frequency design readily offers directly excited peaks, while the more effective parametric resonance can also be called upon when boundary conditions become favourable.

To summarise this aspect of the invention, the first mechanical amplifier may comprise a bi-stable or multi-stable structure, such as a pre-stressed beam, or in more general terms a mechanical amplifier having two or more stable states. The second mechanical amplifier may comprise a parametric resonator and be driven by external vibration by means of, or through, the first mechanical amplifier. The use of a bi-stable, or multi-stable, structure in the first mechanical amplifier may have two main advantages. First, in each of its stable states the multi-stable structure may be more rigid than an equivalent monostable structure. For example a bi-stable structure formed by pre-stressing a beam may be more rigid in one or more of its stable states than a similar beam which is not pre-stressed. A more rigid beam may advantageously be able to transfer more energy to the parametric resonator of the second mechanical amplifier, absorbing less energy itself. Second, the transition of a multi-stable structure between its stable states (snap-through) may transfer a larger amount of energy to the parametric resonator of the second mechanical amplifier. This may advantageously overcome the activation, or threshold, amplitude for causing resonance of the parametric resonator. Once the activation amplitude has been overcome, energy transferred through the multi-stable structure within one of its stable states may be sufficient to maintain parametric resonance.

FIGS. 37, 38 and 39 illustrate a further embodiment of the invention in which an electro-magnetic energy-harvesting arrangement is used. FIG. 37 shows a perspective view of an energy harvester, with its front mounting plate omitted for clarity, FIG. 38 shows a view corresponding to FIG. 37 but showing details in phantom, and FIG. 39 shows a view of the internal structure of the energy harvester of FIGS. 37 and 38.

The energy harvester comprises a direct resonator in the form of a resilient beam 300, anchored at its end (not shown). This is the first mechanical amplifier of the harvester. A parametric resonator in the form of a cantilever 302 extends upwardly from the beam 300. The beam and the cantilever are fabricated from beryllium copper or spring steel. The cantilever is preferably upwardly oriented during use, to place it in an unstable position, to encourage parametric resonance. Two permanent magnets 304 are secured on either side of the cantilever 302. The cantilever and magnets are positioned between, and closely spaced from, coils 306 retained within cup-shaped coil holders 308. Each coil holder is secured to a mounting plate 310 for support. The resonant frequencies of the beam 300 and the parametric resonator are matched, preferably so as to form an auto-parametric resonator as described above.

The magnets are preferably NdFeB magnets.

During operation, vibration of the magnets between the coils enables electrical power to be drawn from the coils.

The invention claimed is:

1. An energy harvester for harvesting energy from an input vibration, comprising:
    a first mechanical amplifier responsive to the input vibration; and
    a second mechanical amplifier coupled to and driven with an output of the first mechanical amplifier;

in which at least one of the first and second mechanical amplifiers comprises a parametric resonator driven in parametric resonance;

and in which an energy harvester power output is generated by electrically damping the second mechanical amplifier.

2. An energy harvester according to claim 1, in which said energy harvester power output is an electrical power output and the second mechanical amplifier is electrically damped to generate the electrical power output.

3. An energy harvester according to claim 1, in which the first mechanical amplifier is not electrically damped.

4. An energy harvester according to claim 1, in which the first mechanical amplifier is not electrically damped.

5. An energy harvester according to claim 1, in which the first mechanical amplifier comprises the parametric resonator.

6. An energy harvester according to claim 5, in which the second mechanical amplifier comprises a non-resonant mechanical amplifier, a direct resonator or a further parametric resonator.

7. An energy harvester according to claim 6, in which the non-resonant mechanical amplifier, the direct resonator or the further parametric resonator is electrically damped to generate said energy harvester power output.

8. An energy harvester according to claim 6, in which the second mechanical amplifier comprises a further mechanical amplifier, coupled to the non-resonant mechanical amplifier, the direct resonator or the further parametric resonator, and in which the further mechanical amplifier is damped to generate said energy harvester power output.

9. An energy harvester according to claim 1, in which the second mechanical amplifier comprises the parametric resonator.

10. An energy harvester according to claim 9, in which the first mechanical amplifier comprises a direct resonator.

11. An energy harvester according to claim 10, in which the direct resonator of the first mechanical amplifier and the parametric resonator of the second mechanical amplifier form an auto-parametric amplifier.

12. An energy harvester according to claim 10, in which the resonant frequency of the direct resonator is a sub-multiple of the resonant frequency of the parametric resonator.

13. An energy harvester according to claim 9, in which the first mechanical amplifier is a non-resonant mechanical amplifier.

14. An energy harvester according to claim 9, in which the parametric resonator is electrically damped to generate said energy harvester power output.

15. An energy harvester according to claim 9, in which the second mechanical amplifier comprises a further mechanical amplifier, coupled to the parametric resonator, and in which the further mechanical amplifier is electrically damped to generate said energy harvester power output.

16. An energy harvester according to claim 1, in which the energy harvester is a macro-scale device, a micro-scale device, a thick-film device, a thin-film device or a MEMS device.

17. An energy harvester according to claim 1, in which the first and second mechanical amplifiers provide first and second degrees of freedom.

18. An energy harvester according to claim 1, in which the first mechanical amplifier has a rest position which is in an unstable equilibrium.

19. An energy harvester according to claim 1, comprising one or more resonators which can be excited in at least one of the direct and parametric resonance.

20. An energy harvester for harvesting energy from an input vibration, comprising:
 a first mechanical amplifier responsive to the input vibration; and
 a second mechanical amplifier coupled to and driven with an output of the first mechanical amplifier driven in parametric resonance;
 in which at least one of the first and second mechanical amplifiers comprises a parametric resonator; and
 an electrical damping mechanism for generating an energy harvester power output, in which the electrical damping mechanism does not act directly on the first mechanical amplifier.

21. A method for harvesting mechanical vibration, comprising the steps of:
 driving a first mechanical amplifier with the vibration;
 driving a second mechanical amplifier with an output of the first mechanical amplifier; and
 extracting a power output by electrically damping the second mechanical amplifier;
 in which at least one of the first and second mechanical amplifiers is a resonator driven in parametric resonance.

22. An energy harvester for harvesting energy from an input vibration, comprising:
 a first mechanical amplifier comprising a direct resonator responsive to the input vibration; and
 a second mechanical amplifier coupled to the first mechanical amplifier and comprising a parametric resonator;
 in which a resonant frequency $\omega$ of the direct resonator is a sub-multiple of a resonant frequency $\omega_0$ the parametric resonator, such that $\omega = 2\omega_0/n$, where n is the order of the sub-multiple; and in which an energy harvester power output is generated by electrically damping the second mechanical amplifier.

23. The energy harvester of claim 22, in which a resonant frequency of the direct resonator of the first mechanical amplifier is about twice a resonant frequency of the parametric resonator of the second mechanical amplifier.

* * * * *